(12) United States Patent
Liu et al.

(10) Patent No.: US 9,755,031 B2
(45) Date of Patent: Sep. 5, 2017

(54) TRENCH EPITAXIAL GROWTH FOR A FINFET DEVICE HAVING REDUCED CAPACITANCE

(71) Applicants: STMicroelectronics, Inc., Coppell, TX (US); International Business Machines Corporation, Armonk, NY (US); GlobalFoundries Inc, Grand Cayman (KY)

(72) Inventors: Qing Liu, Watervliet, NY (US); Xiuyu Cai, Niskayuna, NY (US); Ruilong Xie, Schenectady, NY (US); Chun-Chen Yeh, Clifton Park, NY (US)

(73) Assignees: STMicroelectronics, Inc., Coppell, TX (US); International Business Machines Corporation, Armonk, NY (US); GlobalFoundries Inc., Grand Cayman (KY)

(*) Notice: Subject to any disclaimer, the term of this patent is extended or adjusted under 35 U.S.C. 154(b) by 107 days.

(21) Appl. No.: 14/577,431

(22) Filed: Dec. 19, 2014

(65) Prior Publication Data

US 2016/0181381 A1 Jun. 23, 2016

(51) Int. Cl.
| | |
|---|---|
| *H01L 21/336* | (2006.01) |
| *H01L 29/417* | (2006.01) |
| *H01L 29/66* | (2006.01) |
| *H01L 29/06* | (2006.01) |
| *H01L 29/78* | (2006.01) |

(52) U.S. Cl.
CPC .... *H01L 29/41783* (2013.01); *H01L 29/0653* (2013.01); *H01L 29/66545* (2013.01); *H01L 29/66795* (2013.01); *H01L 29/785* (2013.01); *H01L 29/7848* (2013.01)

(58) Field of Classification Search
CPC ... H01L 29/105; H01L 29/517; H01L 29/665; H01L 29/66545; H01L 29/6659; H01L 29/6651; H01L 29/7833
See application file for complete search history.

(56) References Cited

U.S. PATENT DOCUMENTS

| | | | |
|---|---|---|---|
| 8,796,759 B2* | 8/2014 | Perng | H01L 29/165 257/328 |
| 9,082,852 B1* | 7/2015 | Liu | H01L 29/785 |

(Continued)

*Primary Examiner* — Zandra Smith
*Assistant Examiner* — John M Parker
(74) *Attorney, Agent, or Firm* — Gardere Wynne Sewell LLP

(57) ABSTRACT

A FinFET device includes a semiconductor fin, a gate electrode extending over a channel of the fin and sidewall spacers on each side of the gate electrode. A dielectric material is positioned on each side of a bottom portion of said fin, with an oxide material on each side of the fin overlying the dielectric material. A recessed region, formed in the fin on each side of the channel region, is delimited by the oxide material. A raised source region fills the recessed region and extends from the fin on a first side of the gate electrode to cover the oxide material to a height which is in contact with the sidewall spacer. A raised drain region fills the recessed region and extends from the fin on a second side of the gate electrode to cover the oxide material to a height which is in contact with the sidewall spacer.

30 Claims, 23 Drawing Sheets

(56) References Cited

U.S. PATENT DOCUMENTS

| | | | | |
|---|---|---|---|---|
| 2006/0014366 A1* | 1/2006 | Currie | ............... | H01L 21/76254 438/517 |
| 2007/0287272 A1* | 12/2007 | Bauer | ............... | H01L 21/02529 438/485 |
| 2011/0117732 A1* | 5/2011 | Bauer | ............... | H01L 21/02381 438/507 |
| 2013/0049140 A1* | 2/2013 | Asenov | ................ | H01L 29/517 257/411 |
| 2014/0065774 A1* | 3/2014 | Chang | ................ | H01L 29/7848 438/157 |
| 2014/0070316 A1* | 3/2014 | Chan | ............... | H01L 21/823412 257/347 |
| 2014/0167163 A1* | 6/2014 | Cheng | ................ | H01L 29/785 257/347 |
| 2015/0137193 A1* | 5/2015 | Cheng | ................ | H01L 29/7842 257/288 |
| 2016/0163850 A1* | 6/2016 | Liu | ....................... | H01L 29/785 257/338 |

* cited by examiner

TRENCH EPITAXIAL GROWTH FOR A FINFET DEVICE HAVING REDUCED CAPACITANCE

TECHNICAL FIELD

The present invention relates to the fabrication of integrated circuits and, more particularly, to a process for the formation of FinFET-type integrated circuit devices and a FinFET device produced by such a process.

BACKGROUND

A FinFET transistor utilizes a channel region which is oriented to conduct an electrical current parallel to the surface of the substrate. The channel region is provided in an elongated section of semiconductor material referred to in the art as a "fin." The source and drain regions of the transistor are typically also formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions separated from each other by an intermediate gate portion, where the transistor gate spans with a perpendicular orientation over the multiple elongated sections.

It is well known in the art to form the source and drain regions of the transistor using epitaxial growth starting from a top surface of the fin on either side of the gate and channel region. There are number of benefits which accrue from the use of a tall epitaxial growth. First, because of the generally tapered shape of the sidewall spacers for the gate structure, the width between adjacent gate structures increases with height, and thus a taller epitaxial growth will result in a larger surface area at the top of the epitaxial growth for use in siliciding the source or drain contact. Second, increased epitaxial growth height makes the circuit more robust to issues with contact gouging. Third, the profile of the contact etch bottom profile into the epitaxial growth can be tuned to increase contact area if a greater epitaxial growth height is available. Fourth, increased epitaxial growth provides more material for consumption during a salicidation process associated with forming the source/drain contacts. Fifth, there is a lessened risk of shorting. Sixth, the top surface of the epitaxial growth could be patterned with channels or other depth structures to increase the contact area and area available for salicidation.

However, the growth of taller epitaxial regions for the source and drain on the top surface of the fin can violate design spacing rules. There is accordingly a need in the art for a method to better confine epitaxial growth for source and drain regions of FinFET transistor in a manner which permits a taller epitaxial growth with reduced risk of violating design spacing rules.

SUMMARY

In an embodiment, an integrated FinFET transistor circuit comprises: a fin of semiconductor material; a transistor gate electrode extending over a channel region of said fin; sidewall spacers on each side of the transistor gate electrode; wherein said fin further includes a recessed region on each side of the channel region; an oxide material on each side of each recessed region in the fin; a raised source region of epitaxial growth material filling said recessed region and extending from said fin on a first side of the transistor gate electrode to cover the oxide material to a height above said fin and in contact with the sidewall spacer; and a raised drain region of said epitaxial growth material filling said recessed region and extending from said fin on a second side of the transistor gate electrode to cover the oxide material to said height above said fin and in contact with the sidewall spacer.

In an embodiment, a method for manufacturing a FinFET transistor, comprises: forming a fin of semiconductor material; forming a transistor gate structure that extends over a channel region of said fin; forming sidewall spacers on each side of the transistor gate electrode; depositing an oxide material on each side of the fin; forming recessed regions at a top of the fin adjacent the channel region on each side of the transistor gate electrode, wherein said oxide material is present on each side of the recessed regions; and epitaxially growing epitaxial growth material from said fin to fill the recessed regions and extend from said fin to form a raised source region on one side of the transistor gate structure to cover the oxide material to a height above said fin and in contact with the sidewall spacer and form a raised drain region on another side of the transistor gate structure to cover the oxide material to said height above said fin and in contact with the sidewall spacer.

In an embodiment, an integrated FinFET transistor circuit, comprises: a fin of semiconductor material; a dielectric material on each side of a bottom portion of said fin; an oxide material on each side of said fin above the dielectric material; a transistor gate electrode extending over a channel region of said fin; sidewall spacers on each side of the transistor gate electrode; wherein said fin further includes a recessed region on each side of the channel region, with said oxide material on each side of each recessed region in the fin; a raised source region of epitaxial growth material filling said recessed region and extending from said fin on a first side of the transistor gate electrode to cover the oxide material to a height above said fin and in contact with the sidewall spacer; and a raised drain region of said epitaxial growth material filling said recessed region and extending from said fin on a second side of the transistor gate electrode to cover the oxide material to said height above said fin and in contact with the sidewall spacer.

BRIEF DESCRIPTION OF THE DRAWINGS

For a better understanding of the embodiments, reference will now be made by way of example only to the accompanying figures in which.

DETAILED DESCRIPTION OF THE DRAWINGS

Reference is now made to FIGS. 1-12 showing process steps for the formation of an integrated circuit including FinFET devices. It will be understood that the illustrations provided do not necessarily show the features drawn to scale.

Figure 1:
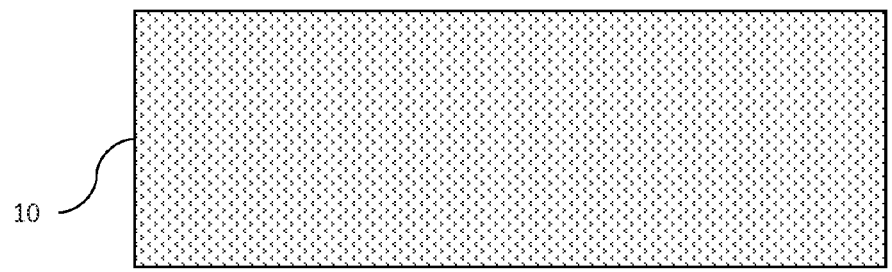
FIGS. 1-12 show process steps for the formation of an integrated circuit including FinFET devices.

The process starts with a substrate 10 as shown in FIG. 1. The substrate 10 may comprise a silicon on insulator (SOI) substrate wafer of a conventional type (including an extremely thin silicon on insulator (ETSOI) or ultra-thin body and buried oxide (UTBB) silicon on insulator (SOI) known to those skilled in the art). Alternatively, the substrate 10 may comprise a bulk semiconductor substrate wafer. The top semiconductor layer of the SOI substrate or the semiconductor material of the bulk substrate may be doped as appropriate for the integrated circuit application (and in the present implementation the substrate material which will eventually be formed into a fin need not be doped at all). In an embodiment of an SOI substrate, the top semiconductor layer may be of the fully depleted (FD) configuration. The bulk substrate may include, for example, a number of epitaxially grown semiconductor layers. The process techniques described herein are equally applicable to SOI and bulk substrates, as well as other types of substrate, and thus a generic representation of the substrate 10 is shown in FIG. 1 and referenced throughout the description.

Figure 2A:
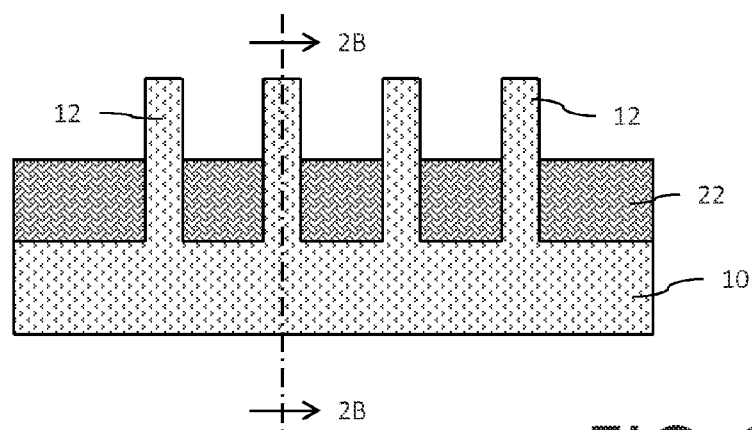
Figure 2B:
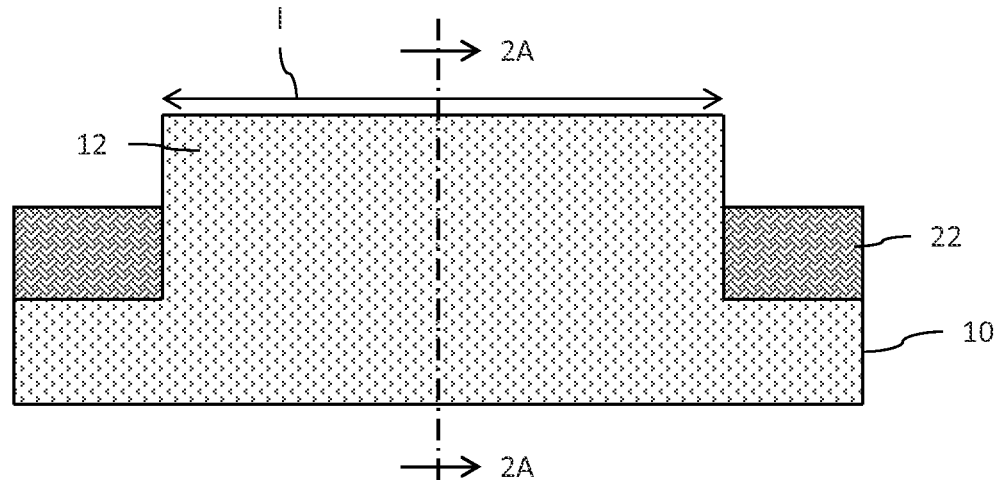

Using fabrication techniques well known to those skilled in the art, a plurality of fins 12 of semiconductor material are formed at the top surface of the substrate 10. The result of the fin fabrication process is shown in cross-sectional FIGS. 2A and 2B, wherein the illustrated orientations of FIGS. 2A and 2B are orthogonal to each other. The fins 12 may, for example, be made of silicon, silicon-germanium, or other suitable semiconductor materials. The fins 12 may, for example, be doped as appropriate for the integrated circuit application. The fins may be separated from each other by a dielectric or other insulating material 22.

Figure 3A:
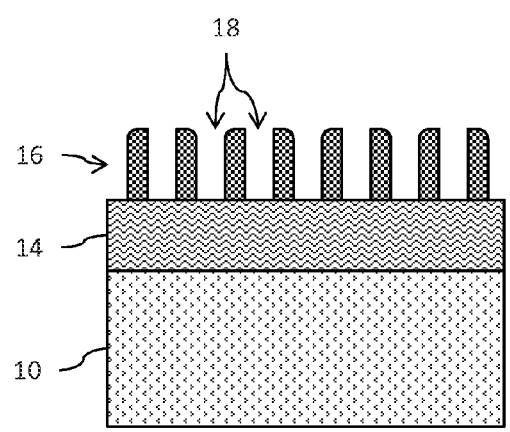
Figure 3B:
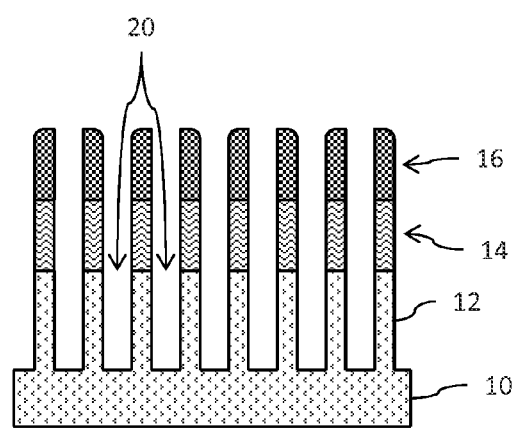
Figure 3C:
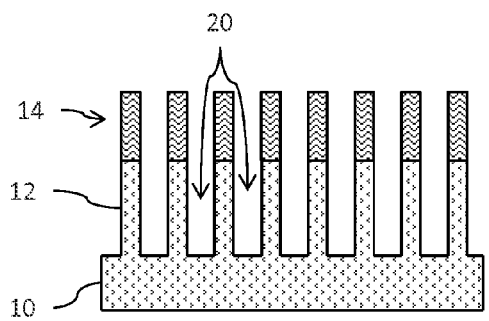
Figure 3D:
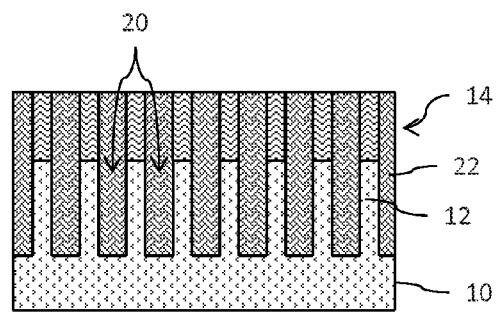
Figure 3E:
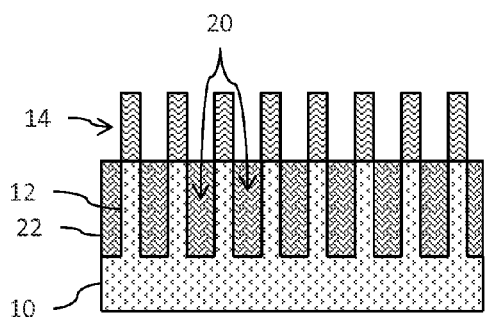
Figure 3F:
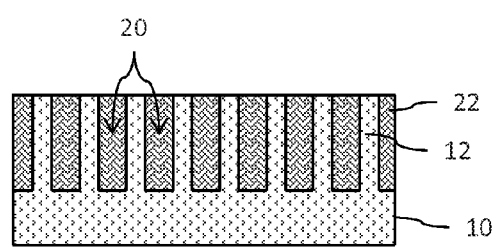
Figure 3G:
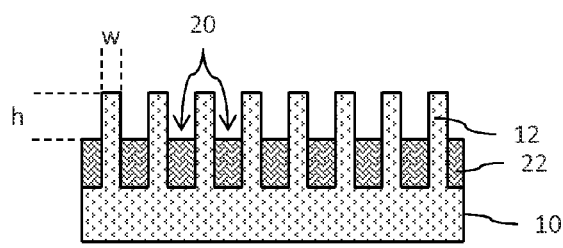

An example of the process for fin fabrication is shown in FIGS. 3A-3G. In FIG. 3A, a hard mask layer 14 (for example, of silicon nitride SiN) is deposited on the substrate 10. Over the hard mask layer 14, a lithographically patterned mask 16 is formed on the hard mask layer 14. The mask 16 includes a number of mask openings 18 with the lithographic patterning leaving mask material at locations where fins 12 are desired. An etching operation is then performed through the openings 18 to define a plurality of apertures 20 in the top surface of the substrate 10 which define the fins 12. The lithographically patterned mask 16 is then removed as shown in FIG. 3C. A dielectric material 22 is then deposited to fill the apertures 20 as shown in FIG. 3D. An upper portion of the dielectric material 22 is then removed through a recessing operation to expose the remaining portions of the hard mask layer 14 as shown in FIG. 3E. The remaining portions of the hard mask layer 14 are then stripped away as shown in FIG. 3F. The upper portion of the remaining dielectric material 22 is then partially recessed to expose the upper portions of the fins 12 as shown in FIG. 3G.

The individual fins 12 may have an exposed height "h" of 20-50 nm and a width "w" of 6-12 nm. The length "l" of each fin 12 is determined by the application of the transistor and may, for example, be 0.06 to 600 µm.

Figure 4A:
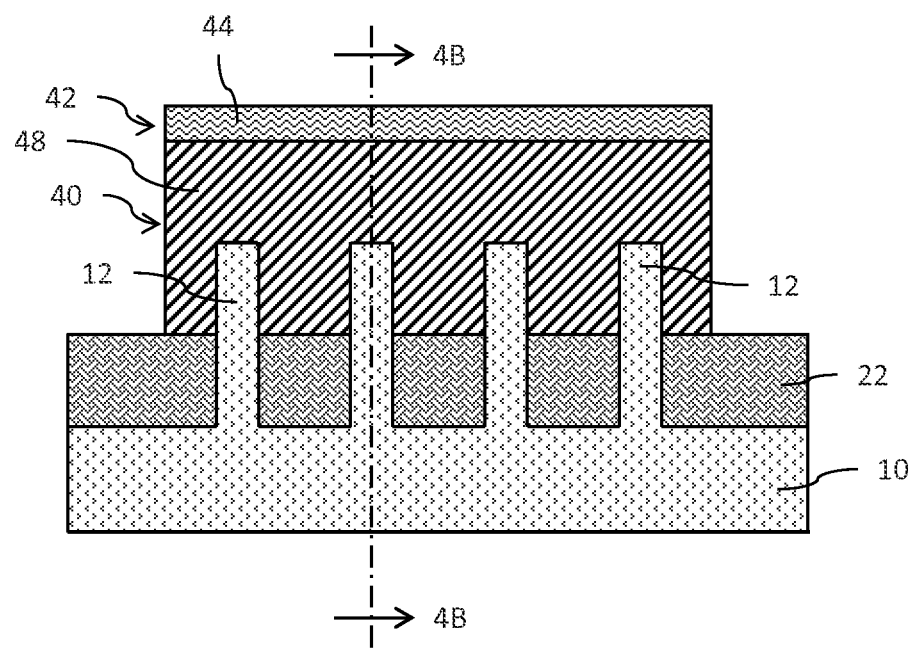
Figure 4B:
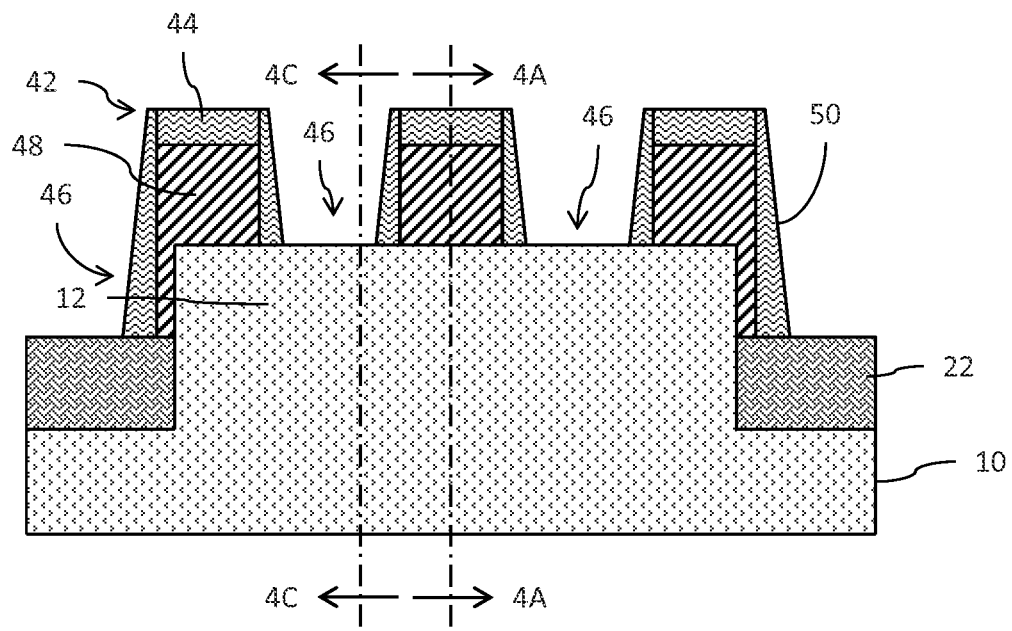
Figure 4C:
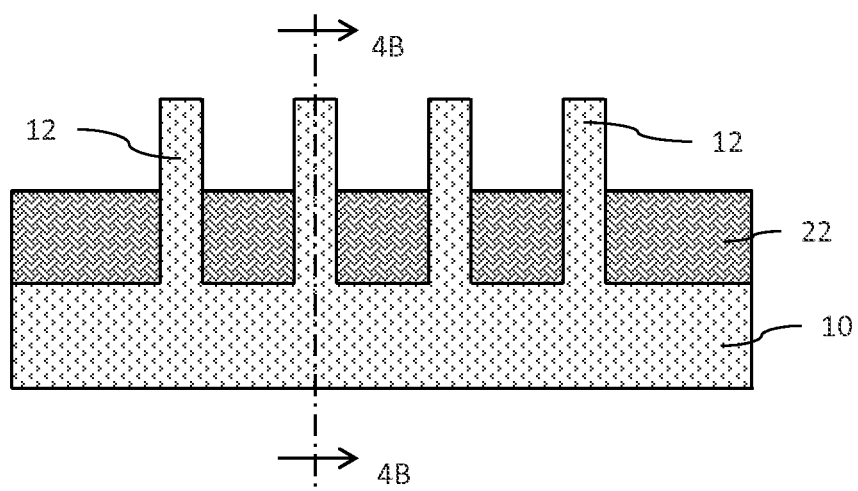

Reference is now made to FIGS. 4A-4C. A sacrificial polysilicon material 40 is deposited using a conventional chemical vapor deposition (CVD) process on the substrate 10 to cover the fins 12 (and the dielectric 22). The polysilicon material 40 may, in an alternative implementation, instead comprise amorphous silicon. A conformal oxide (not explicitly shown) may be formed on the exposed surfaces of the fins 12 prior to deposition of the polysilicon material 40. As understood by those skilled in the art, the polysilicon material (with the oxide) are associated with the formation of structures commonly referred to as "dummy gate" structures. The polysilicon material of the dummy gate structures will be subsequently removed later in the fabrication process and replaced with a metal gate stack defining the actual operating gate electrode for the transistor devices (this process referred to in the art as a "replacement metal gate (RMG)" process). Thus, there is no need to dope the polysilicon material 40. The deposit of the polysilicon material 40 will have a height in excess of the height of the fins 12 so that the fins will be completely covered. The material 40 may have a thickness, for example, of 50-150 nm. The top surface of the polysilicon material 40 deposit is polished using conventional chemical-mechanical planarization (CMP) techniques to provide a planar top surface.

A hard mask layer 42 with a thickness of 30-60 nm is deposited on the planar top surface of the polysilicon material 40 using a chemical vapor deposition (CVD) process. The layer 42 is lithographically patterned in a manner well known to those skilled in the art to leave mask material 44 at desired locations for the dummy gate structures. A reactive ion etch (RIE) is then performed to open apertures 46 in the polysilicon material on either side of the dummy gate 48. The structure of the dummy gate 48 may be considered to straddle over a fin 12, or over a plurality of adjacent fins, at a channel region (see, FIG. 4A).

A silicon nitride material is then conformally deposited, for example, using an atomic layer deposition (ALD) technique as known in the art, and subsequently etched preferentially on the horizontal surfaces to leave sidewall spacers 50 on the side walls of the polysilicon dummy gates 48 (see, FIG. 4B). In one implementation, the etch will remove all silicon nitride material from the fins 12 as shown in FIG. 4C. For an alternatively implementation, see FIG. 13 and the discussion below.

The dummy gate structure accordingly comprises a patterned polysilicon (or amorphous silicon) dummy gate 48, an overlying silicon nitride cap (formed by the mask material 44) and sidewall spacers 50.

It will be noted in FIG. 4B that gate structures have also been formed at the ends of the fin 12 in accordance with the known technique of gate tuck-under. Without this structure, the subsequent formation of raised source/drain structures (described below) could result in epitaxial growth in an outward direction resulting in an increased risk of shorting to an adjacent structure. Additionally, these end structures ensure better quality and consistency of epitaxial growth which may exhibit an non-uniform growth at the ends of the fin in the absence of the end structures.

Figure 5A:
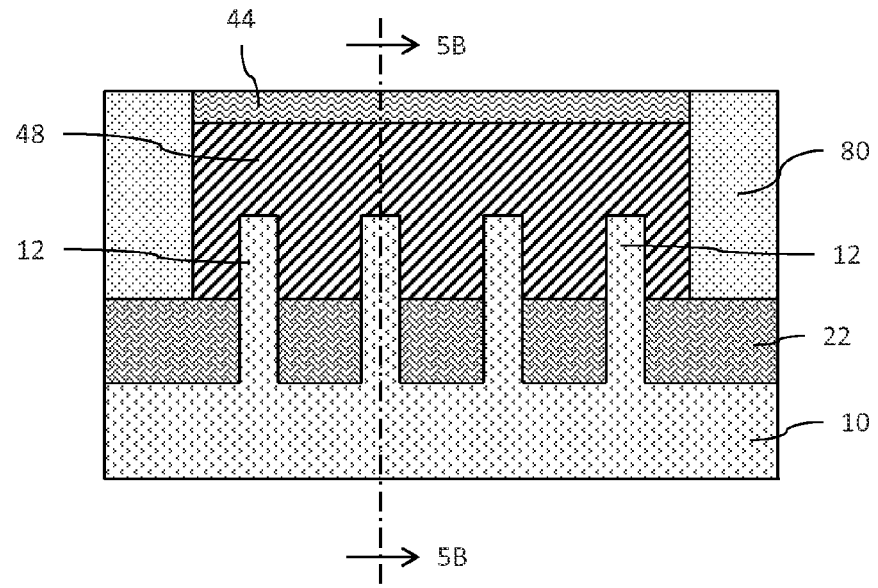
Figure 5B:
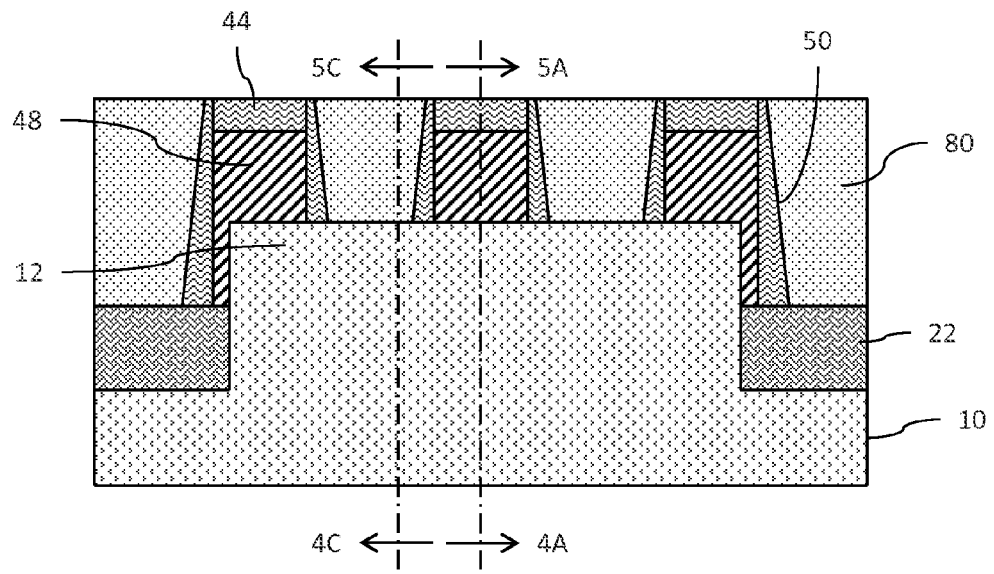
Figure 5C:
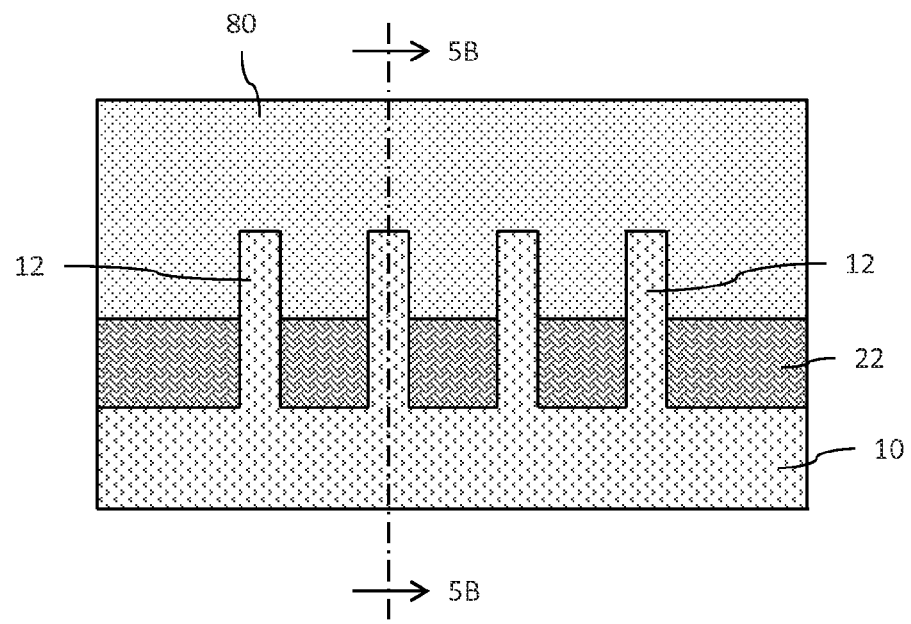

Reference is now made to FIGS. 5A-5C. A silicon dioxide material 80 is deposited to cover the substrate. The material 80 may be further processed using conventional chemical-mechanical planarization (CMP) techniques to provide a planar top surface that stops at the top of each dummy gate structure.

Figure 6A:
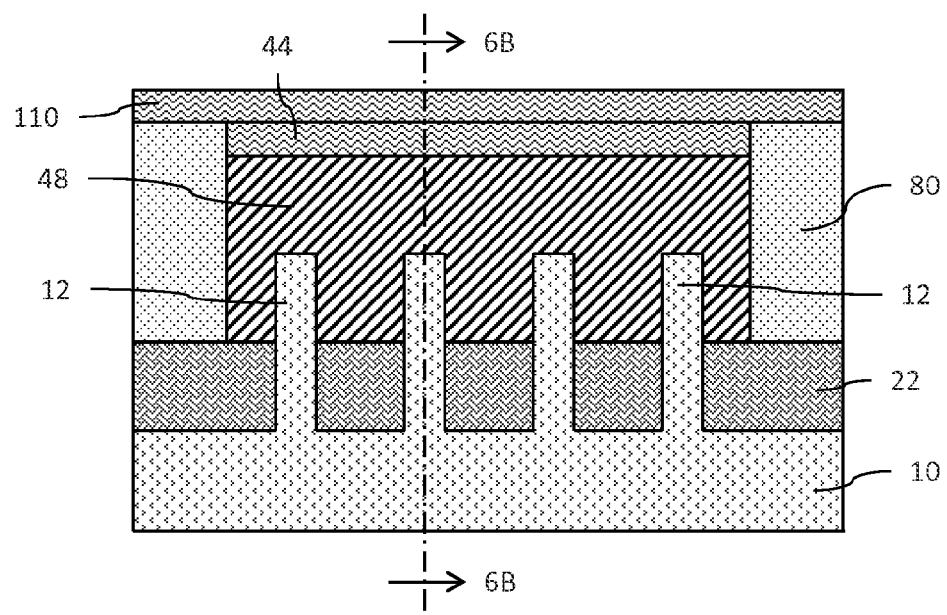
Figure 6B:
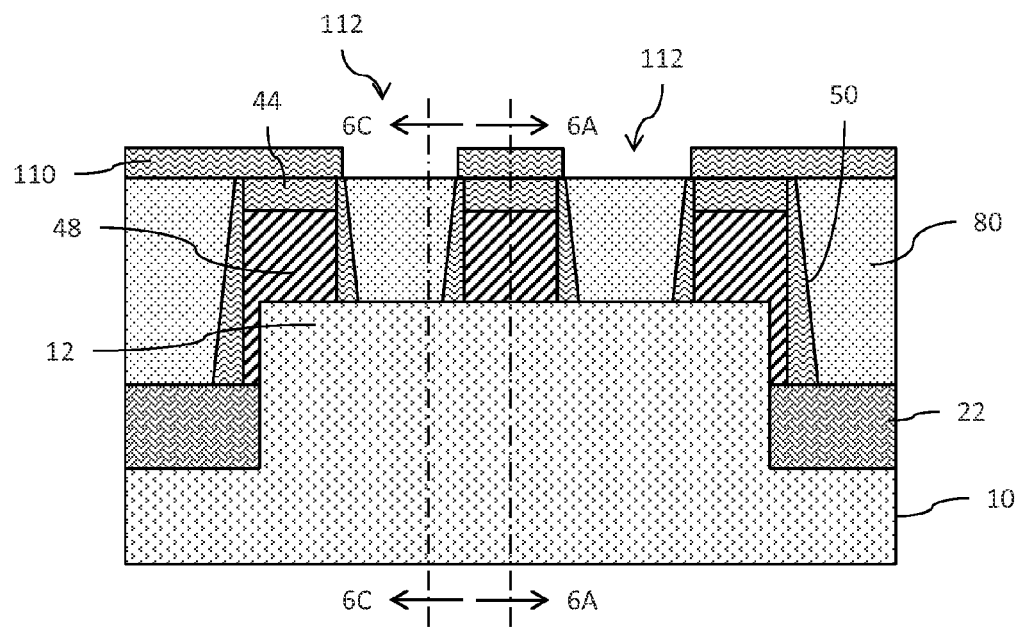
Figure 6C:
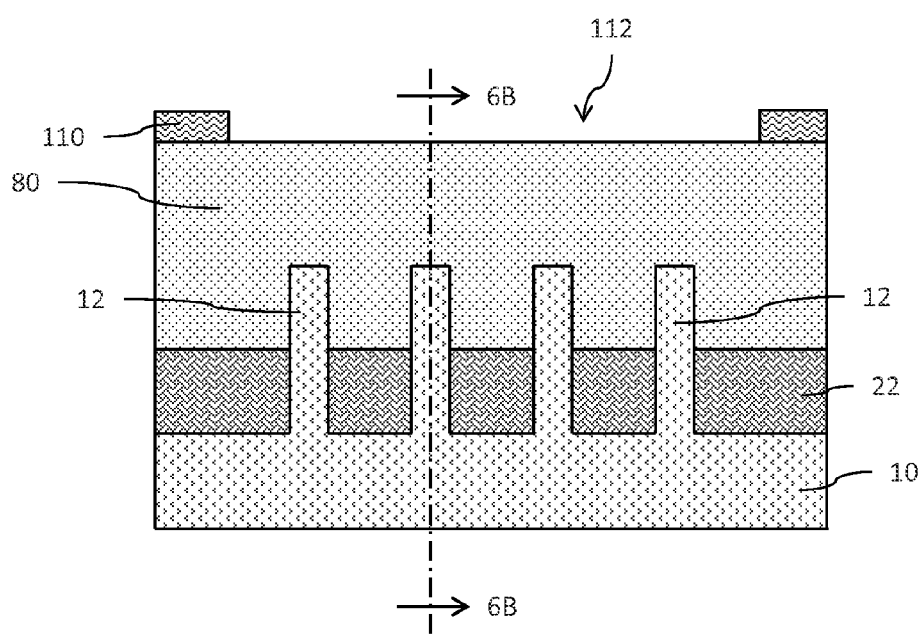

A hard mask layer 110, for example an organic planarization layer (OPL) having a thickness of 100-2000 nm, is then deposited on the planar top surface of the silicon dioxide material 80 layer using a coating process. The layer 110 is lithographically patterned in a manner well known to those skilled in the art to form openings 112 at desired locations for source and drain regions, respectively, of the transistor. The result is shown in FIGS. 6A-6C.

Figure 7A:
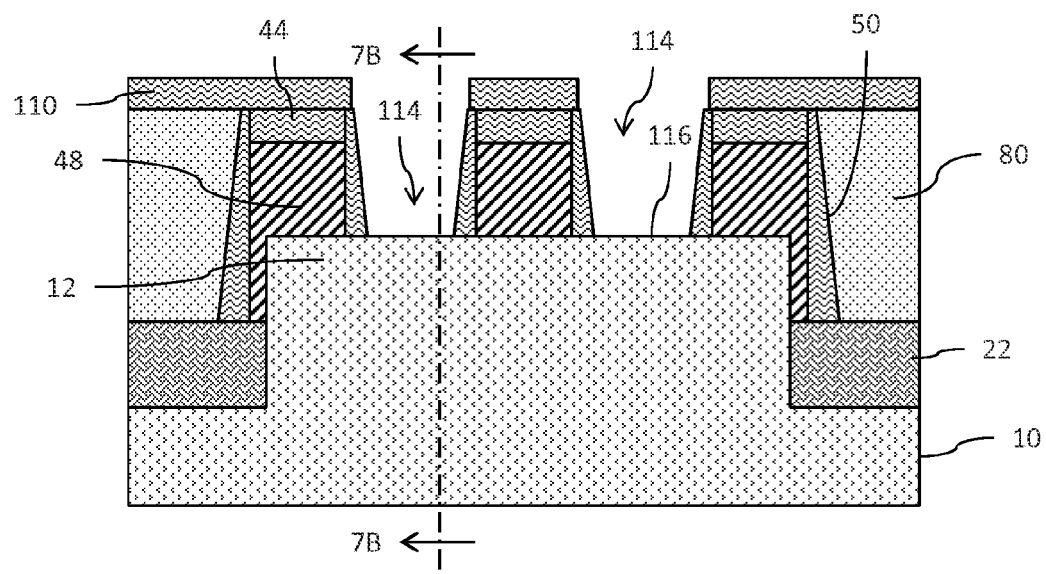
Figure 7B:
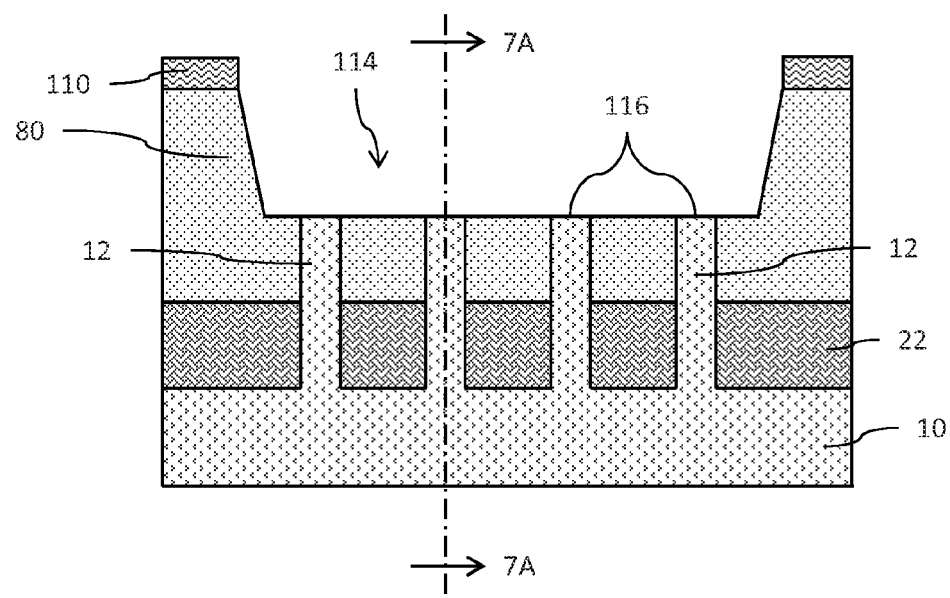

A reactive ion etch (RIE) is then performed through the mask openings 112 to open apertures 114 in the silicon dioxide material 80 layer which extend down to expose a top surface 116 of the fins 12. The result is shown in FIGS. 7A-7B. A cross-section corresponding to FIG. 6A is not presented since the layer 110 prevents etching at that location.

Figure 8A:
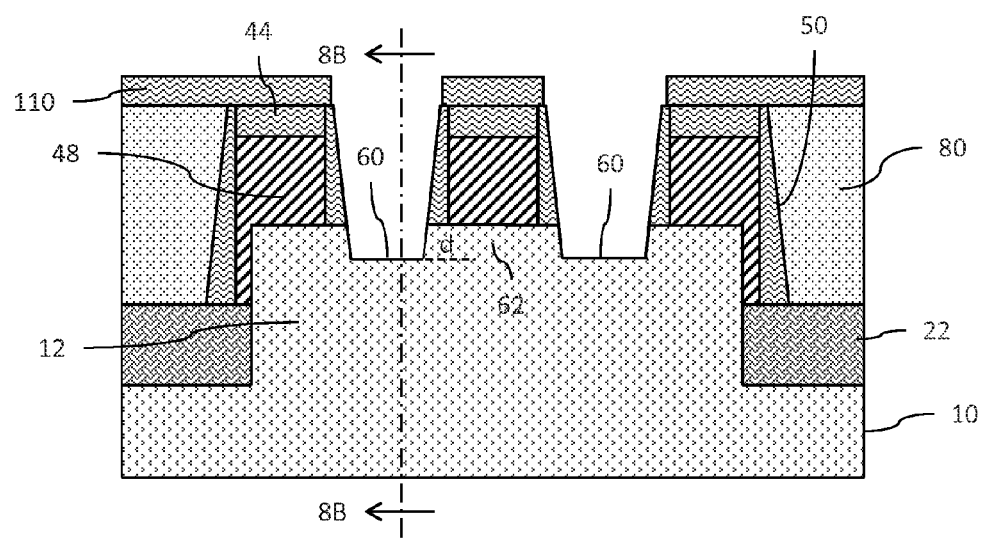
Figure 8B:
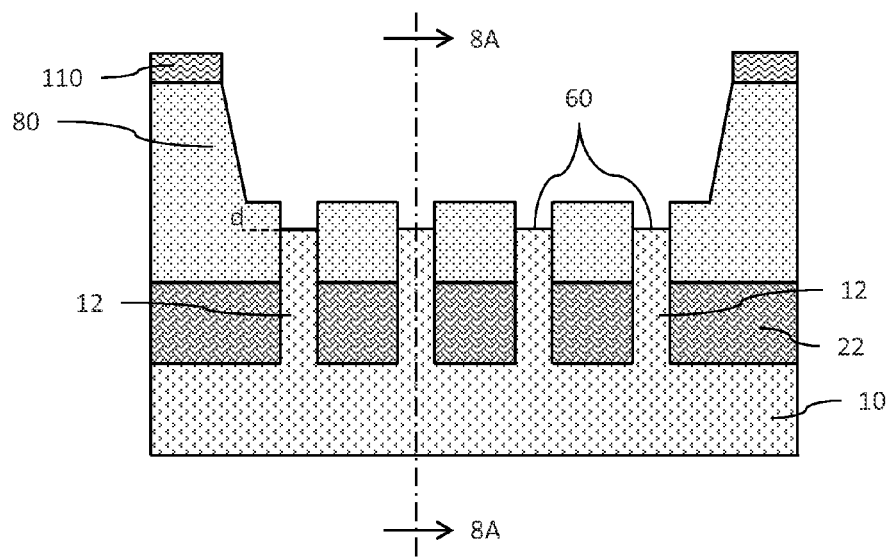

Reference is now made to FIGS. 8A-8B. An etch is then performed to recess 60 the fins 12 on either side of the dummy gate structures. The etch may, for example, comprise an anisotropic (HBr) etch. The depth "d" of the recess 60 may, for example, comprise 20-40 nm. In an embodiment, the recess may extend to a depth equal to a height of the dielectric material 22. The portion 62 of the fin 12 located under the dummy gates 48 between the recess 60 regions defines a channel region of the FinFET transistor. In an embodiment, the channel region 62 may have a length 64 of 15-30 nm.

The amount of the depth d may matter in some applications. The deeper the depth d, the closer the resulting in situ doped source/drain can get to the channel region 62 so as to form a more abrupt junction. However, if a strained channel material is used, the deeper the depth d the more of the material that is cut which can lead to a reduction in the applied strain on the channel. So, selection of the depth d is an important consideration for the transistor designer so as to balance between junction design and strain retention. Thus, it will be understood that the illustration of the depth d in FIGS. 8A-8B is an example of a depth chosen in accordance with this balancing evaluation.

Figure 9A:
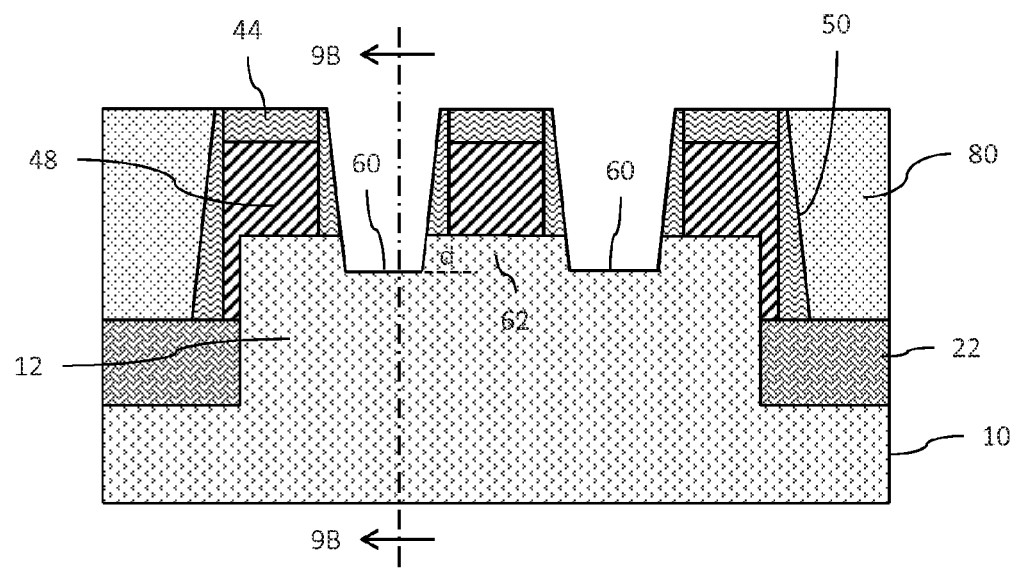
Figure 9B:
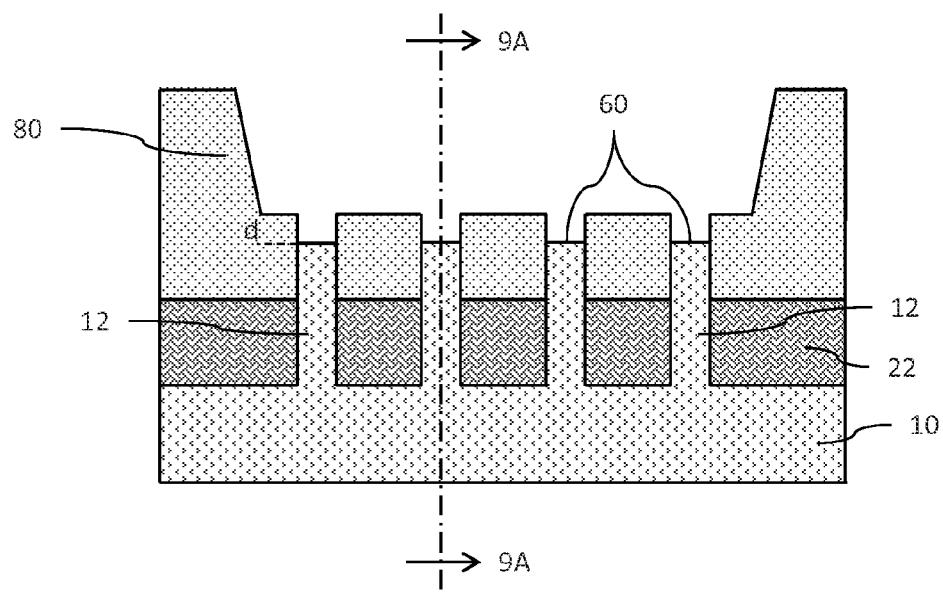

A stripping process is then performed to remove the hard mask layer 110. The result is shown in FIGS. 9A-9B.

Figure 10A:
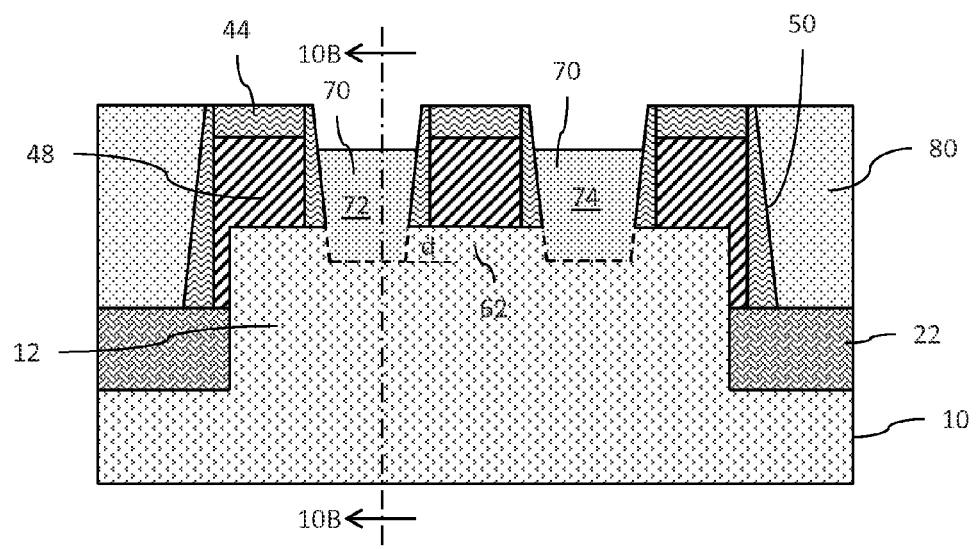
Figure 10B:
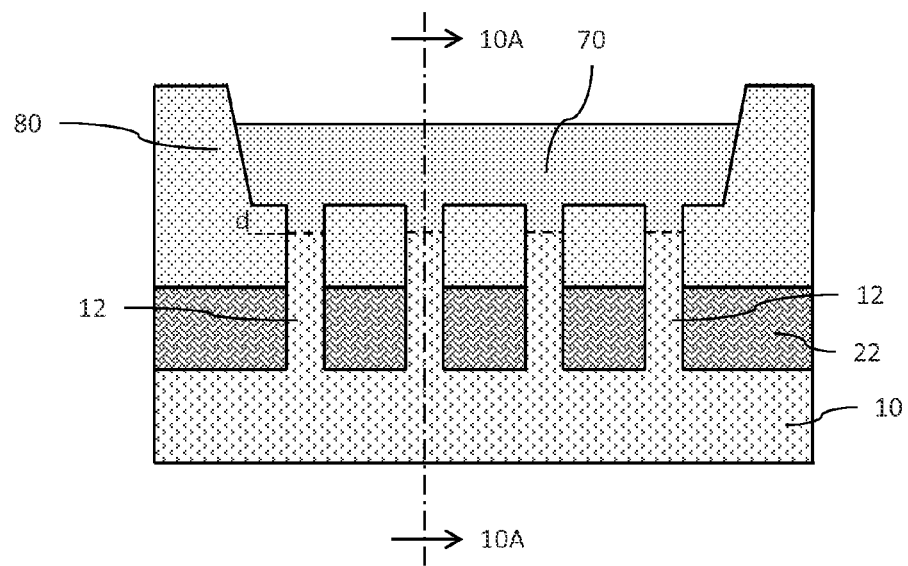

Using an epitaxial process tool and starting from the exposed top surface of the fins 12 in the recess 60 region, an epitaxial growth 70 of a silicon-based semiconductor material is made. The epitaxial growth 70 not only fills the recess 60 regions (adjacent the channel portion 62) but further extends above the previous top surface of the fins to regions adjacent the sidewall spacers 50 on either side of the dummy gate structures and is confined within the apertures 114 with a height that is preferably less than the height of the sacrificial polysilicon dummy gate 48. The silicon-based epitaxial growth 70 may be in situ doped as needed for a given application. As a result of the epitaxial growth 70, raised source and drain regions 72 and 74, respectively, are formed on either side of the dummy gate structures. The result is shown in FIGS. 10A-10B. The epitaxial growth 70 may comprise, for example: silicon doped with boron or indium; silicon-germanium doped with boron or indium; silicon doped with phosphorous or arsenic; or silicon-carbide doped with phosphorous or arsenic. It will be understood that different regions of the substrate may utilize different materials for the epitaxial growth to account for, for example, the need to make transistors of the n-channel or p-channel type.

Figure 11A:
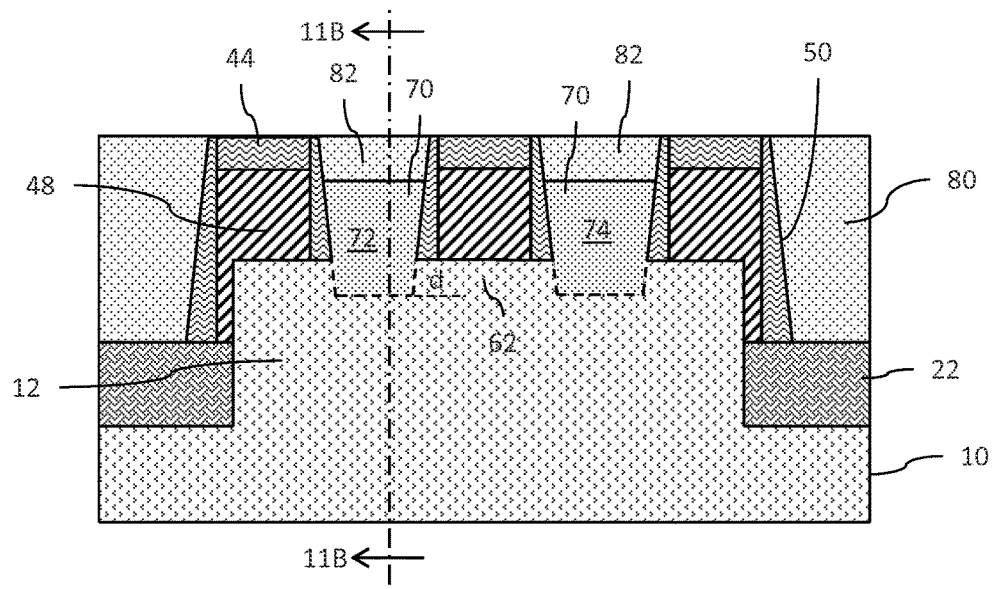
Figure 11B:
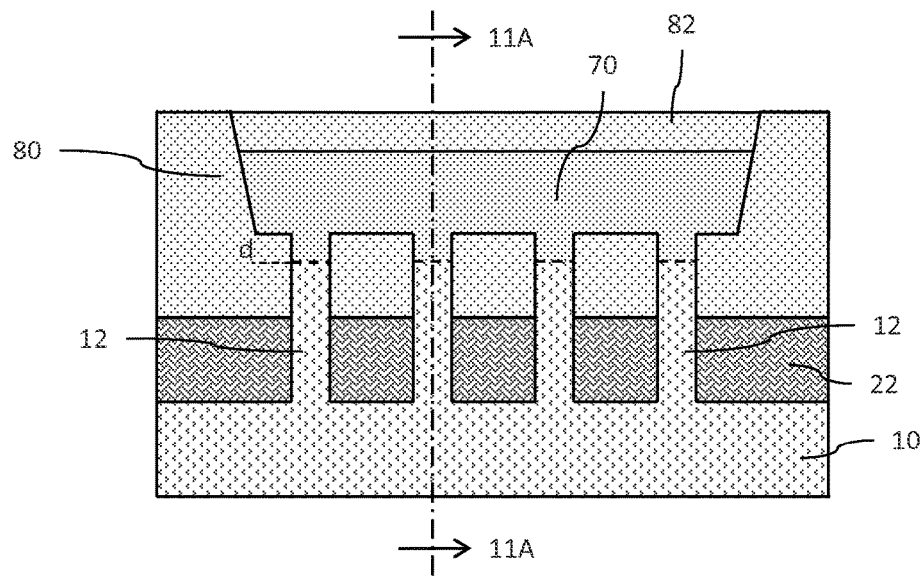

Reference is now made to FIGS. 11A-11B. A silicon dioxide material 82 is deposited to cover the substrate and fill any remaining portions of the apertures 114. The material 82 may be further processed using conventional chemical-mechanical planarization (CMP) techniques to provide a planar top surface that stops at the top of each dummy gate 48.

Figure 12:
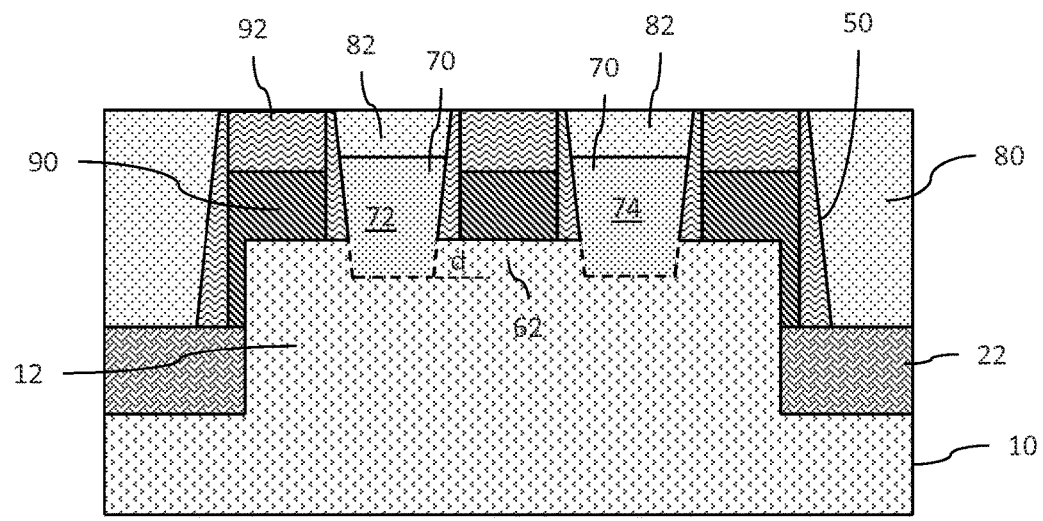

Using a selective removal process (such as an ammonium hydroxide etch), the dummy gates 48 are removed. The removed dummy gates 48 are then replaced with a metal gate structure 90. In an example, the metal gate structure may comprise a high-K dielectric liner (forming the gate dielectric for the transistor) deposited using an atomic layer deposition (ALD) process with a thickness of 1-2 nm, a work function metal deposited using a chemical vapor deposition process and a contact metal fill deposited using a chemical vapor deposition process. An insulating cap 92 covers the metal gate structure 90. The result is shown in FIG. 12.

Further processing well known to those skilled in the art is then performed to produce the metal contacts to the gate (metal gate structure 90), source region 72 and drain region 74.

At this point, front end of line (FEOL) fabrication of the integrated circuit is complete. Further back end of line (BEOL) processing to fabricate metallizations and interconnects may then be performed as well known to those skilled in the art.

Figure 13:
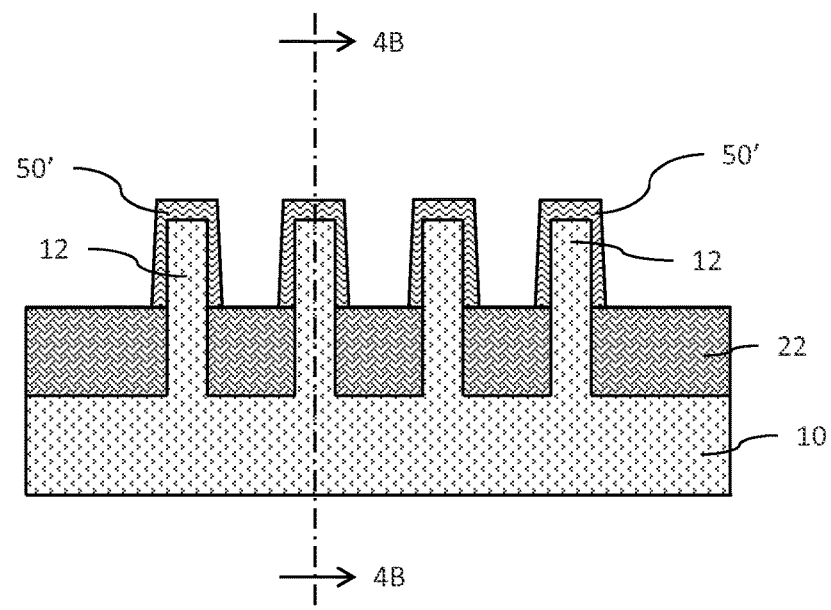
FIGS. 13-15 show process steps relating to a modification of the process of FIGS. 1-12.
Figure 14:
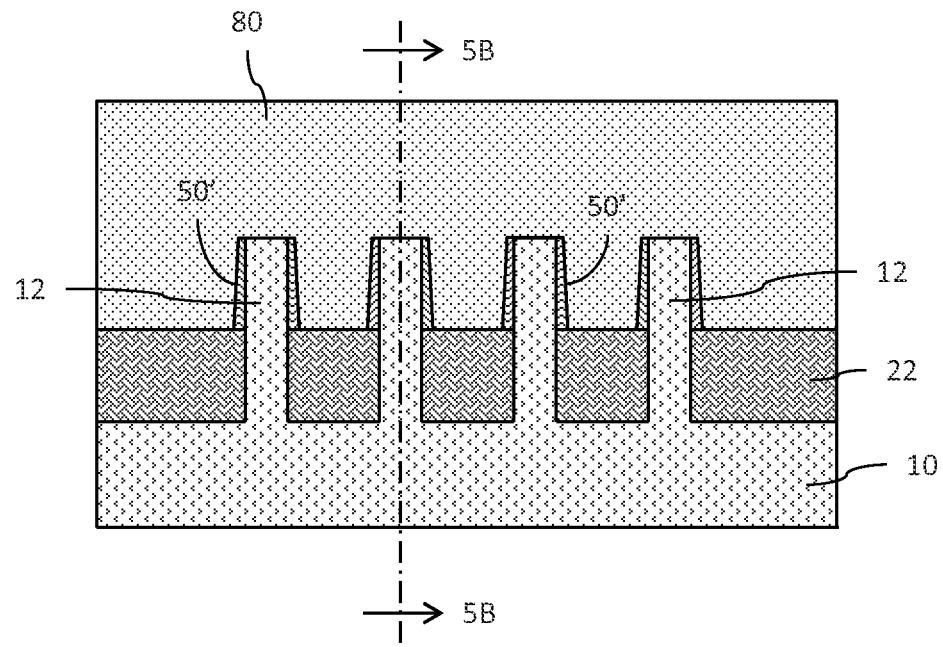
Figure 15:
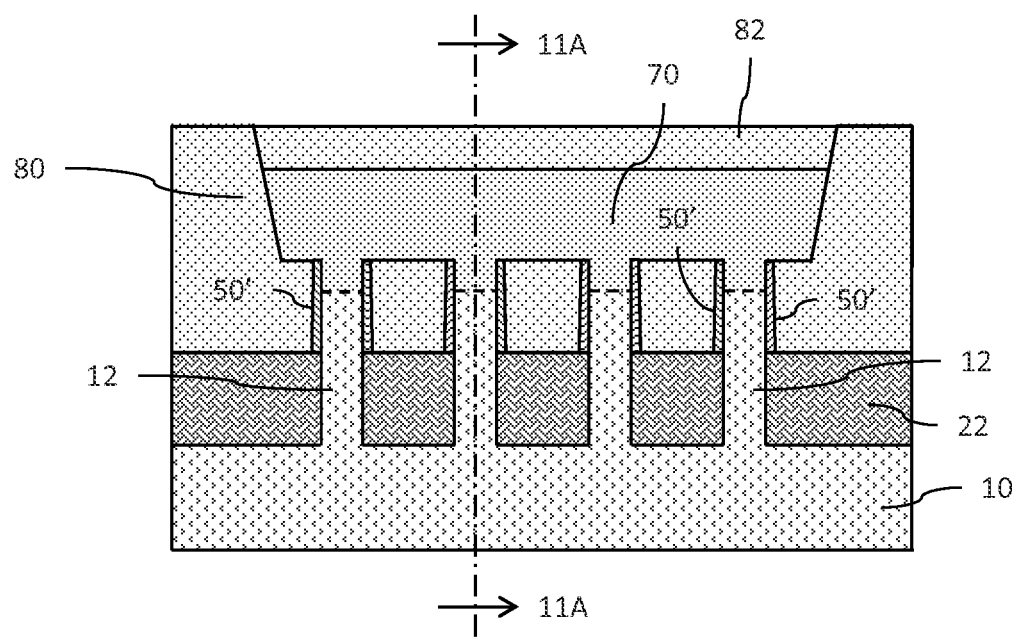

Reference is now once again made to FIGS. 4A-4C. As discussed above, a silicon nitride material is conformally deposited, for example, using an atomic layer deposition (ALD) technique as known in the art, on the substrate and subsequently etched to leave sidewall spacers 50 only on the side walls of the polysilicon dummy gates 48. If the etch does not, however, completely remove the silicon nitride material from the sidewalls of the fins 12, fin sidewall spacers 50' will be left on the sidewalls of the fins. This is shown in FIG. 13 (which corresponds to FIG. 4C prior to the etch) and FIG. 14 (which corresponds to FIG. 5C after the etch). As a result, the fins 12 and epitaxial growth 70 in the recesses 60 will be delimited by the fin sidewall spacers 50' as shown in FIG. 15 (which corresponds to FIG. 11B).

Reference is now made to FIGS. 1-3G and 16A-23 showing process steps for the formation of another integrated circuit including FinFET devices. It will be understood that the illustrations provided do not necessarily show the features drawn to scale.

The description of FIGS. 1-3G is provided above and is incorporated herein by reference.

Figure 16A:
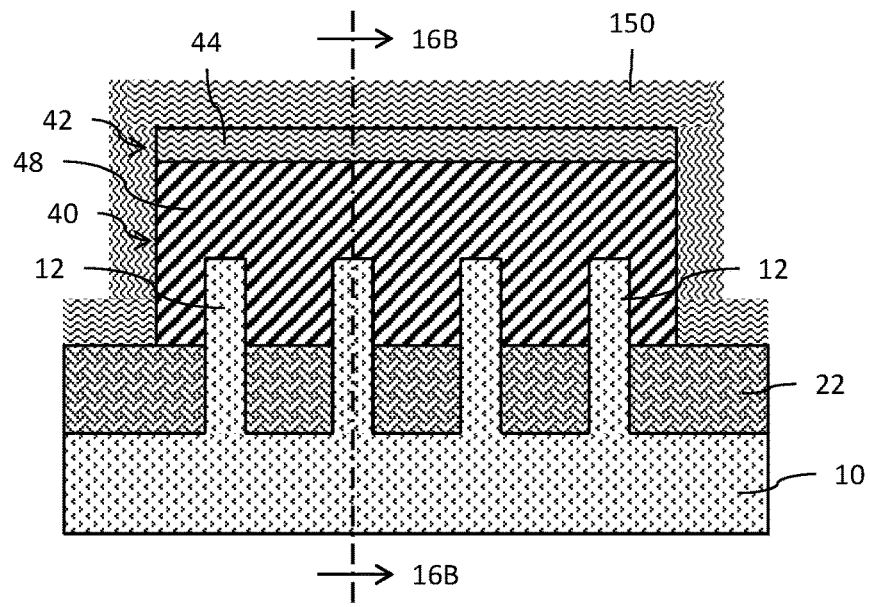
FIGS. 16A-23 show process steps for the formation of another integrated circuit including FinFET devices.
Figure 16B:
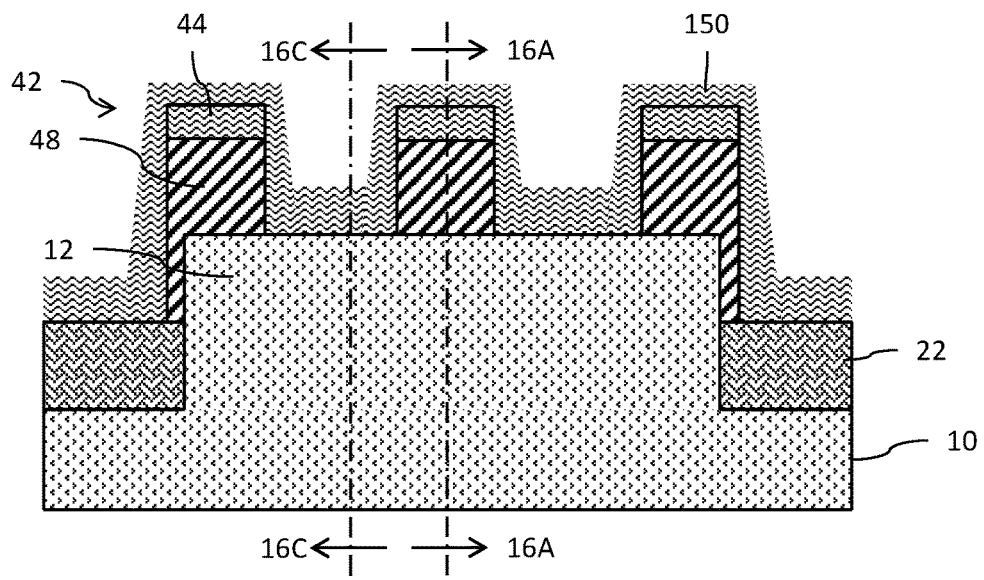
Figure 16C:
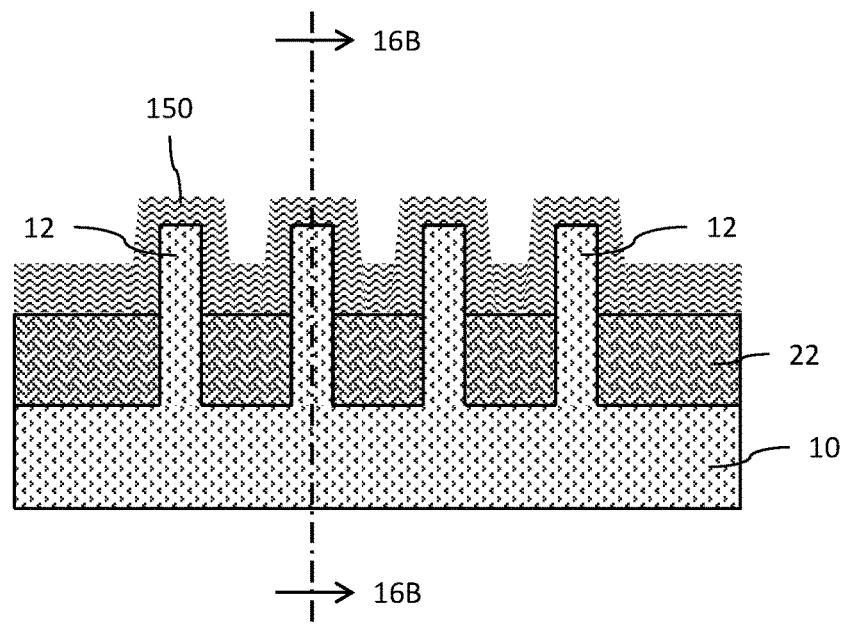

Reference is now made to FIGS. 16A-16C. A sacrificial polysilicon material 40 is deposited using a conventional chemical vapor deposition (CVD) process on the substrate 10 to cover the fins 12 (and the dielectric 22). The polysilicon material 40 may, in an alternative implementation, instead comprise amorphous silicon. A conformal oxide (not explicitly shown) may be formed on the exposed surfaces of the fins 12 prior to deposition of the polysilicon material 40. As understood by those skilled in the art, the polysilicon material (with the oxide) are associated with the formation of structures commonly referred to as "dummy gate" structures. The polysilicon material of the dummy gate structures will be subsequently removed later in the fabrication process and replaced with a metal gate stack defining the actual operating gate electrode for the transistor devices (this process referred to in the art as a "replacement metal gate (RMG)" process). Thus, there is no need to dope the polysilicon material 40. The deposit of the polysilicon material 40 will have a height in excess of the height of the fins 12 so that the fins will be completely covered. The material 40 may have a thickness, for example, of 50-150 nm. The top surface of the polysilicon material 40 deposit is polished using conventional chemical-mechanical planarization (CMP) techniques to provide a planar top surface.

A hard mask layer 42 with a thickness of 30-60 nm is deposited on the planar top surface of the polysilicon material 40 using a chemical vapor deposition (CVD) process. The layer 42 is lithographically patterned in a manner well known to those skilled in the art to leave mask material 44 at desired locations for the dummy gate structures. A reactive ion etch (RIE) is then performed to open apertures 46 in the polysilicon material on either side of the dummy gate 48. The structure of the dummy gate 48 may be considered to straddle over a fin 12, or over a plurality of adjacent fins, at a channel region (see, FIG. 16A).

A silicon nitride material 150 is deposited, for example, using an atomic layer deposition (ALD) technique as known in the art, on the substrate. This material 150 covers the fins 12, the patterned polysilicon (or amorphous silicon) dummy gate 48, the overlying silicon nitride cap (formed by the mask material 44) and the dielectric material 22. In the embodiment shown in FIGS. 4A-4C, a subsequent etch is performed which removes a substantial portion of the material 150 so to leave, for example, sidewall spacers 50 on the sidewalls of the dummy gate structure. In the embodiment associated with FIGS. 16A-16C, however, the etch is not performed so as to leave the conformal material 150 deposit in place.

Figure 17A:
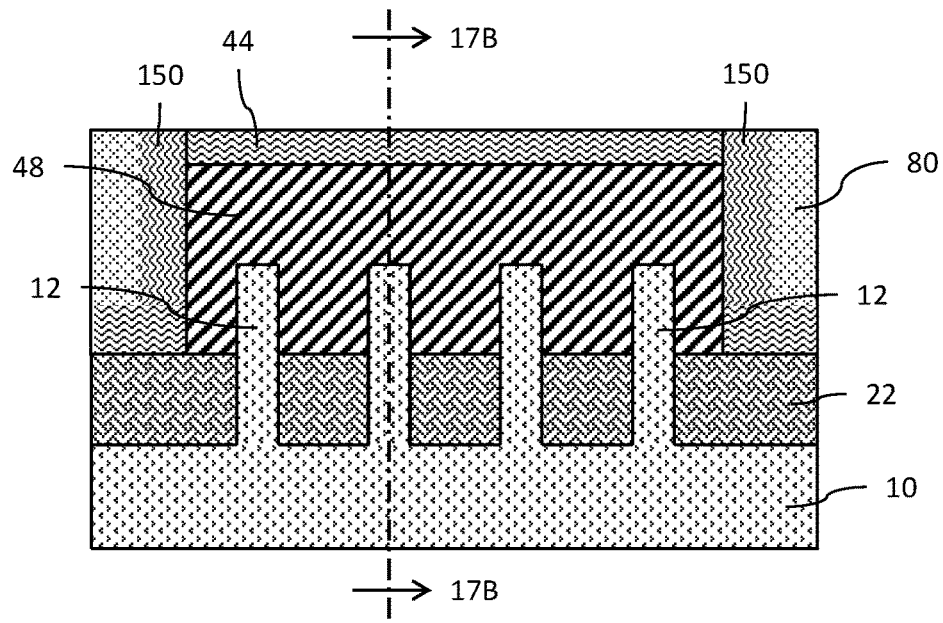
Figure 17B:
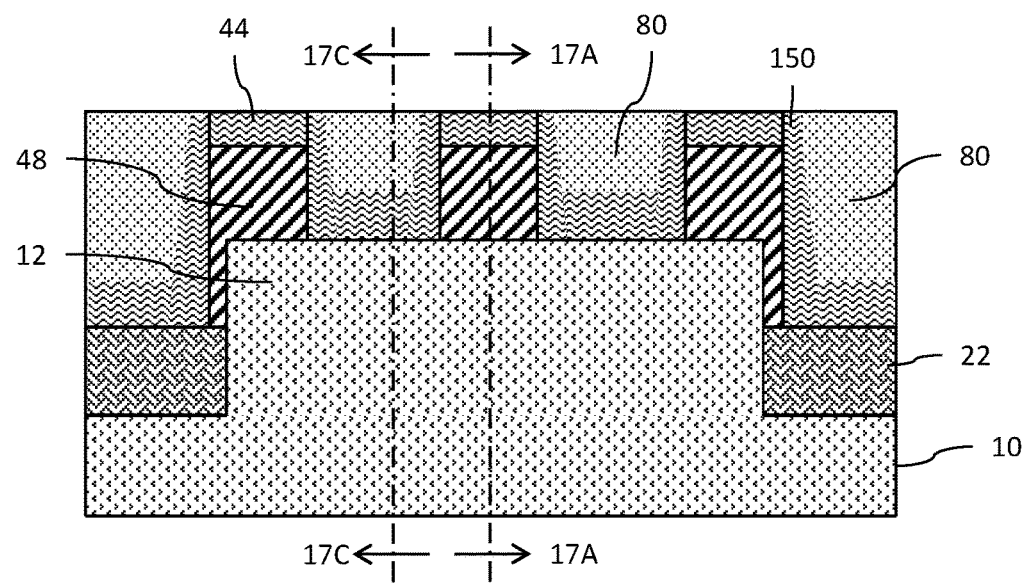
Figure 17C:
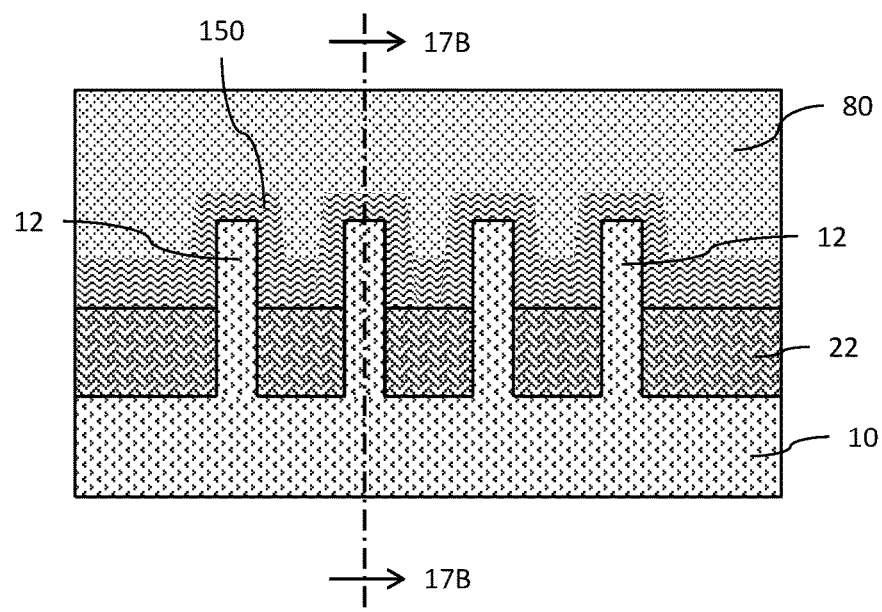

Reference is now made to FIGS. 17A-17C. A silicon dioxide material 80 is deposited to cover the substrate. The material 80 may be further processed using conventional chemical-mechanical planarization (CMP) techniques to provide a planar top surface that stops at the top of each dummy gate structure.

Figure 18A:
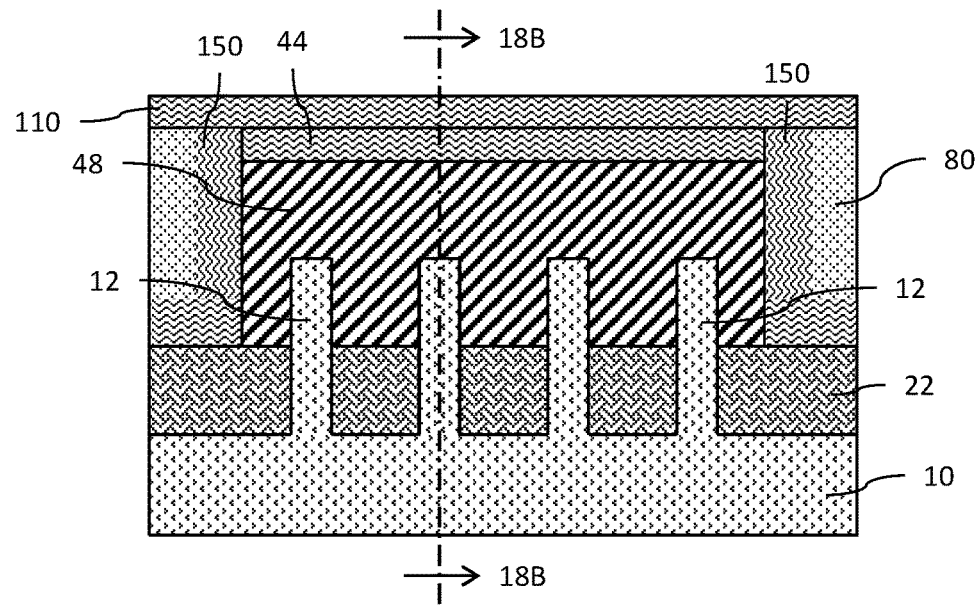
Figure 18B:
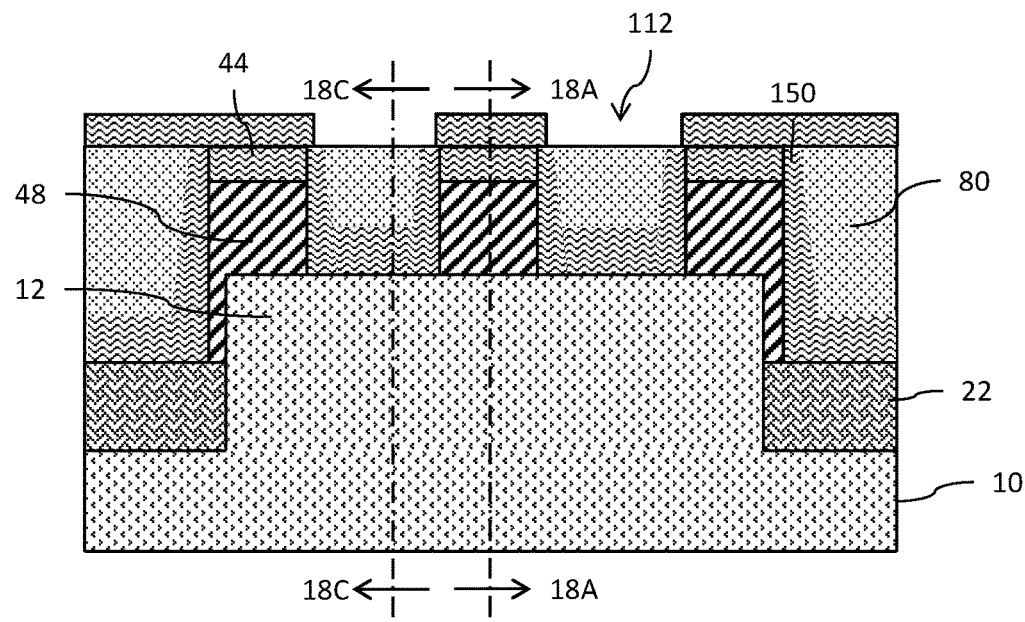
Figure 18C:
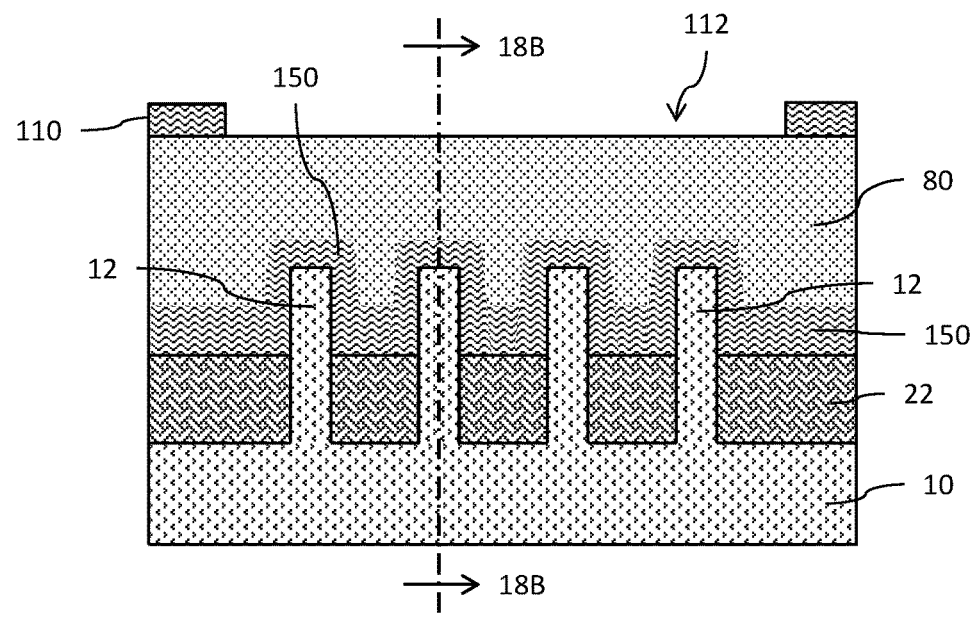

A hard mask layer 110, for example an organic planarization layer (OPL) having a thickness of 100-2000 nm, is then deposited on the planar top surface of the silicon dioxide material 80 layer using a coating process. The layer 110 is lithographically patterned in a manner well known to those skilled in the art to form openings 112 at desired locations for source and drain regions, respectively, of the transistor. The result is shown in FIGS. 18A-18C.

Figure 19A:
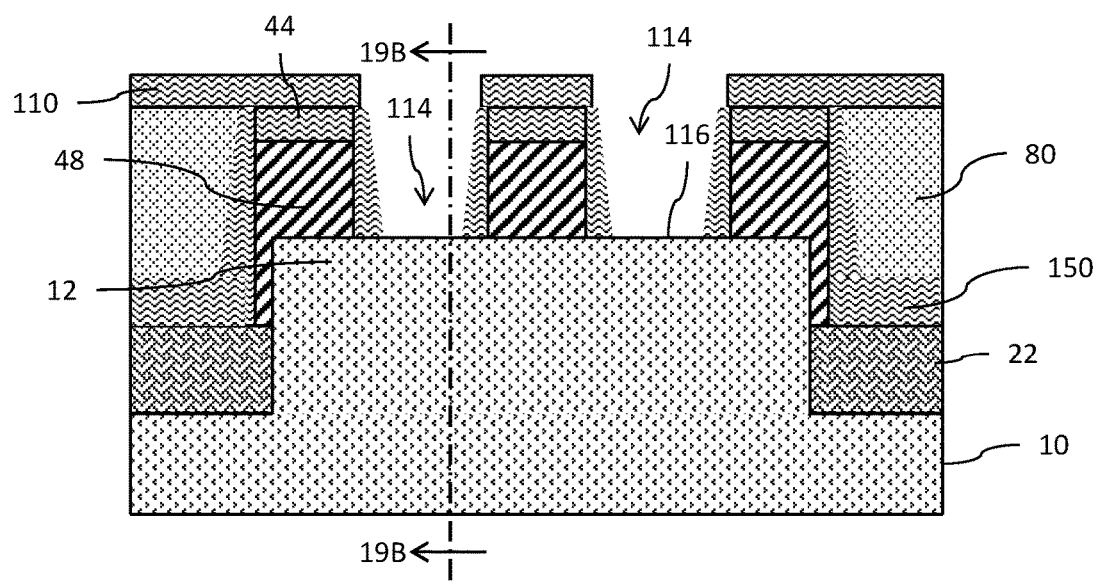
Figure 19B:
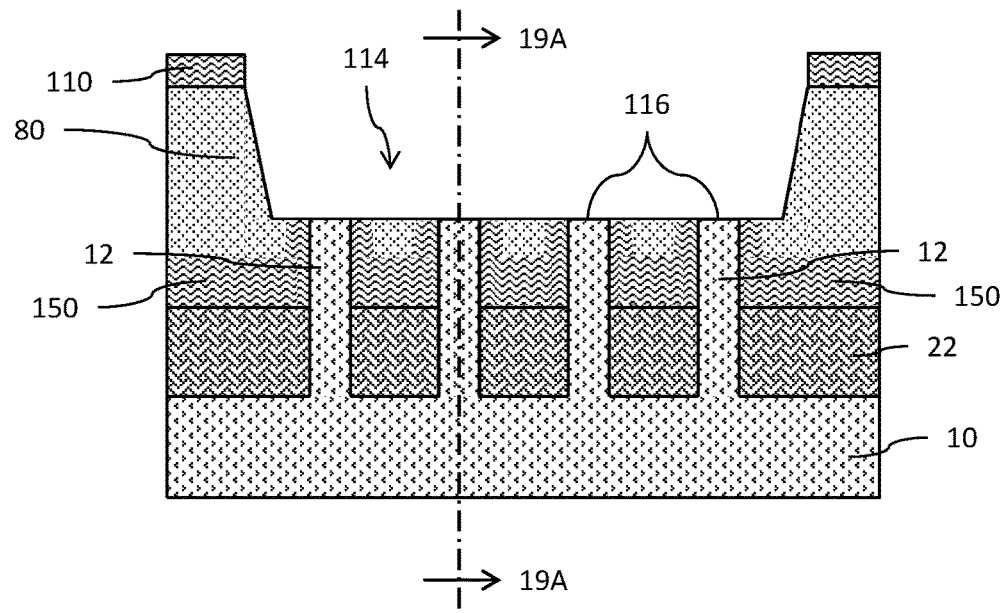

A reactive ion etch (RIE) is then performed through the mask openings 112 to open apertures 114 in the silicon dioxide material 80 layer which extend down to expose a top surface 116 of the fins 12. The result is shown in FIGS. 19A-19B. A cross-section corresponding to FIG. 18A is not presented since the layer 110 prevents etching at that location.

Figure 20A:
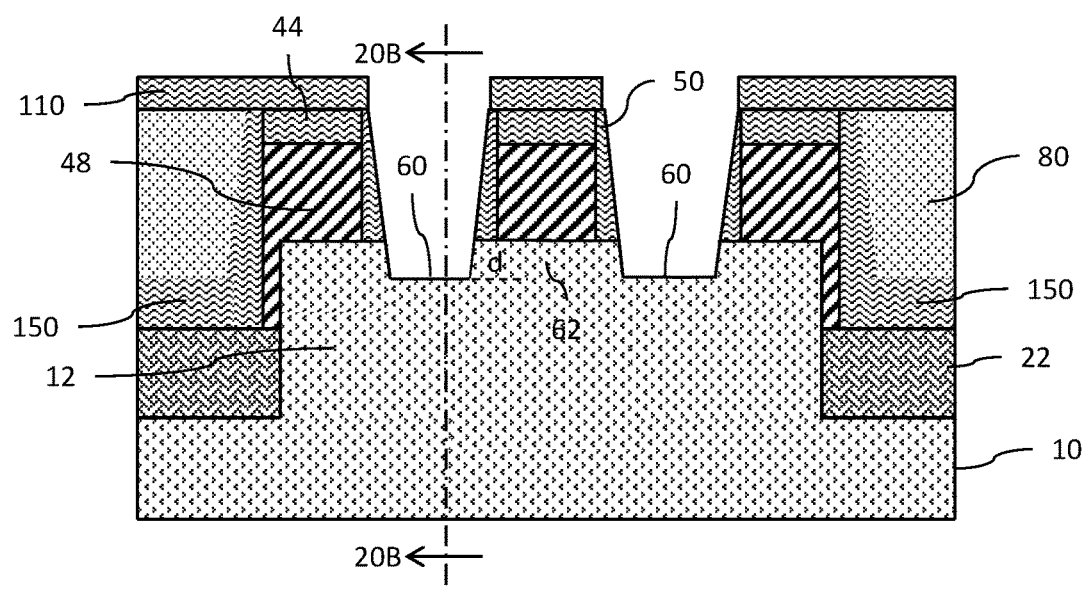
Figure 20B:
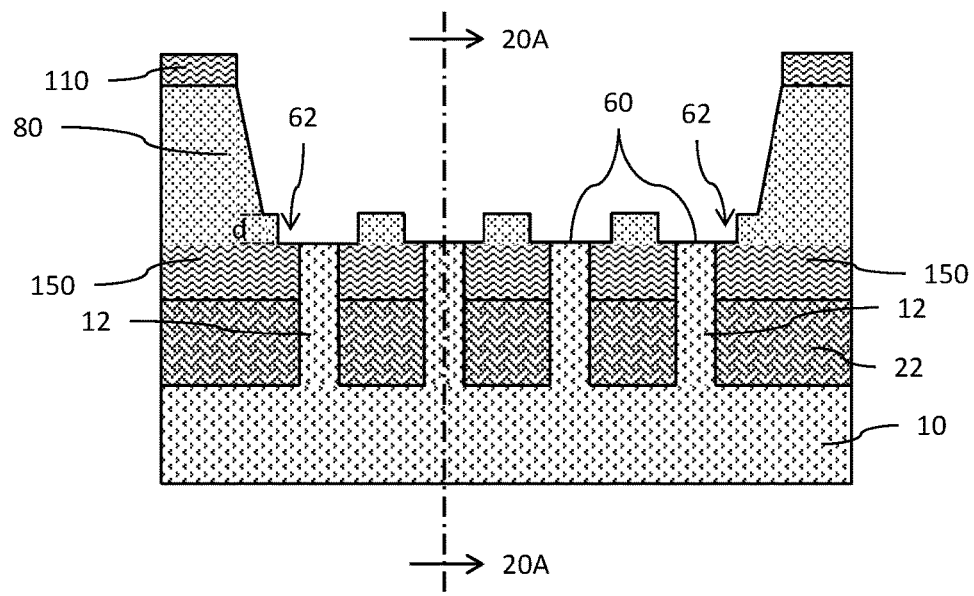

Reference is now made to FIGS. 20A-20B. A further etch is then performed to recess the layer 150, which causes the production of the sidewall spacers 50 (in the apertures 114), and to recess 60 the fins 12 on either side of the dummy gate structures, wherein the recessing of the layer 150 removes material from either side of the fin 12 as well such that the recess 60 is wider than the fin as shown at reference 62. The etch may, for example, comprise an anisotropic (HBr) etch. The depth "d" of the recess 60 may, for example, comprise 20-40 nm. In an embodiment, the recess may extend to a depth equal to a height of the dielectric material 22. The portion 62 of the fin 12 located under the dummy gates 48 between the recess 60 regions defines a channel region of the FinFET transistor. In an embodiment, the channel region 62 may have a length 64 of 15-30 nm.

A stripping process is then performed to remove the hard mask layer 110. The result is not shown, but may be understood by cross-reference to FIGS. 9A-9B.

Figure 21A:
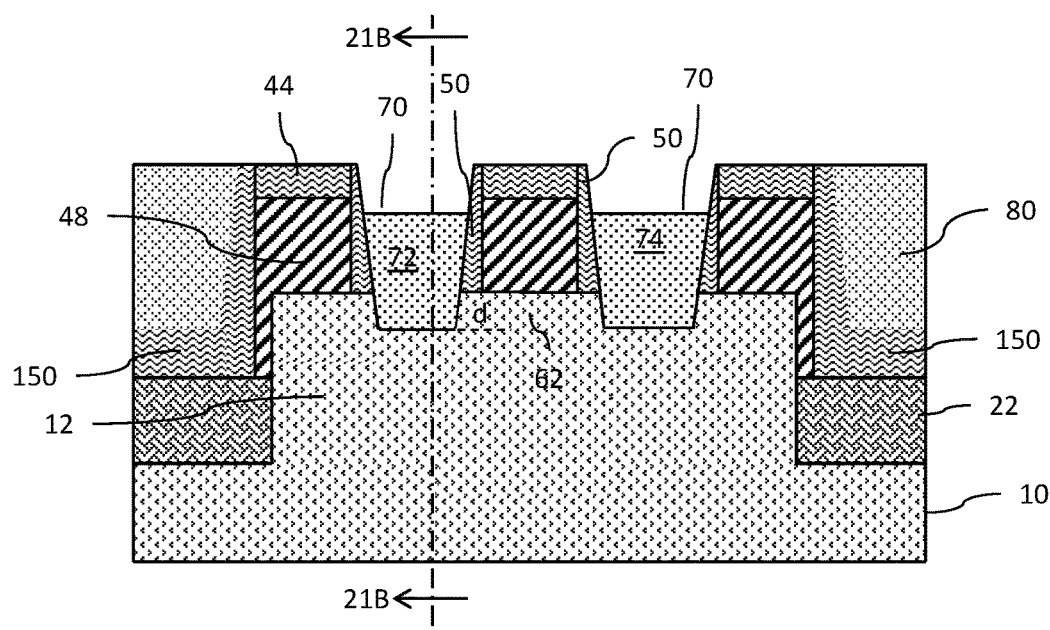
Figure 21B:
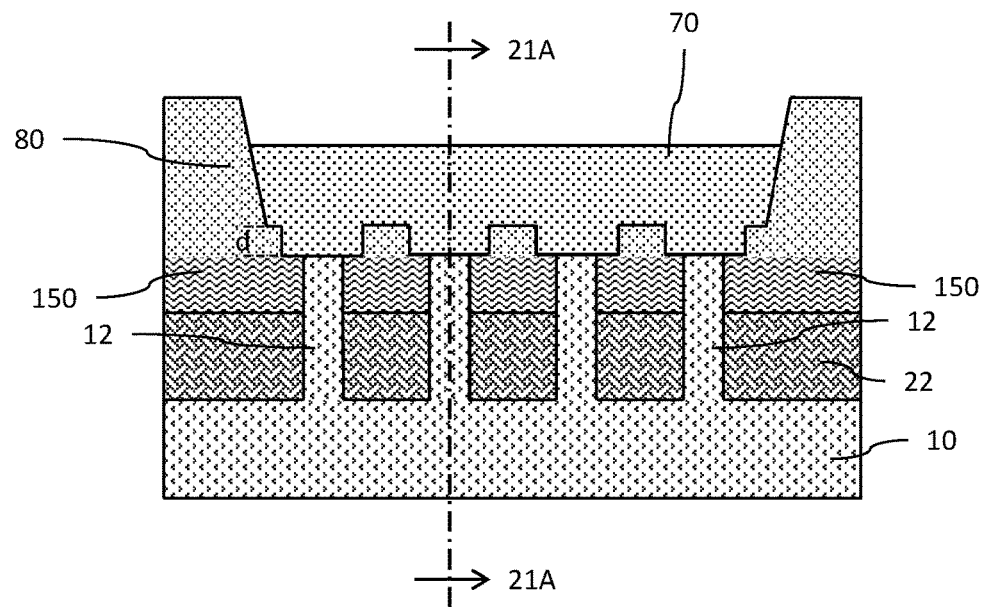

Using an epitaxial process tool and starting from the exposed top surface of the fins 12 in the recess 60 region, an epitaxial growth 70 of a silicon-based semiconductor material is made. The epitaxial growth 70 not only fills the recess 60 regions (adjacent the channel portion 62) but further extends above the previous top surface of the fins to regions adjacent the sidewall spacers 50 on either side of the dummy gate structures and is confined within the apertures 114 with a height that is preferably less than the height of the sacrificial polysilicon dummy gate 48. The silicon-based epitaxial growth 70 may be in situ doped as needed for a given application. As a result of the epitaxial growth 70, raised source and drain regions 72 and 74, respectively, are formed on either side of the dummy gate structures. The result is shown in FIGS. 21A-21B. The epitaxial growth 70 may comprise, for example: silicon doped with boron or indium; silicon-germanium doped with boron or indium; silicon doped with phosphorous or arsenic; or silicon-carbide doped with phosphorous or arsenic. It will be understood that different regions of the substrate may utilize different materials for the epitaxial growth to account for, for example, the need to make transistors of the n-channel or p-channel type.

Figure 22A:
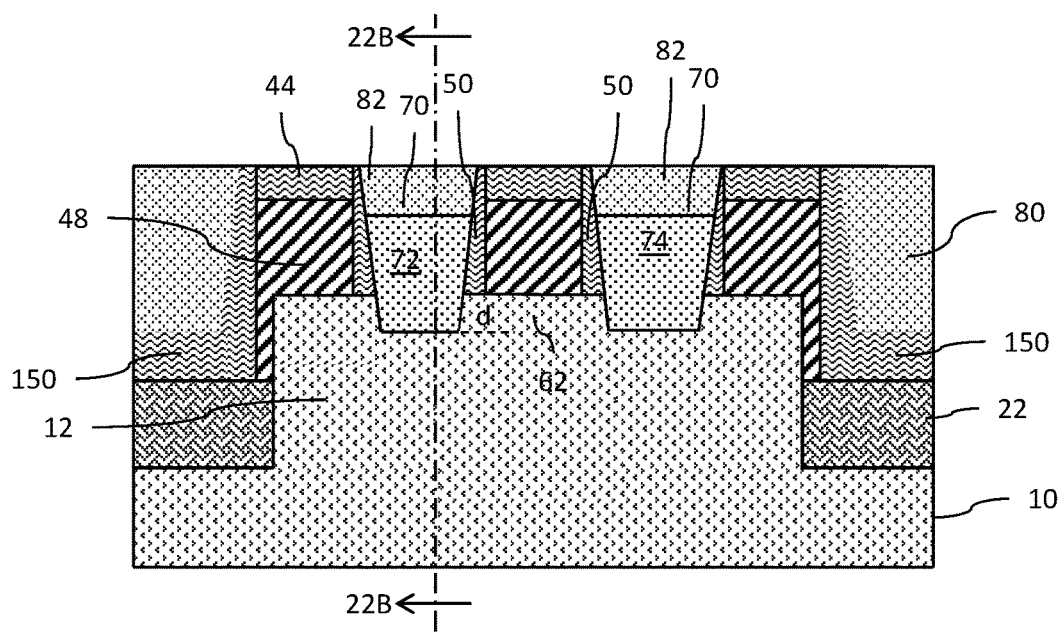
Figure 22B:
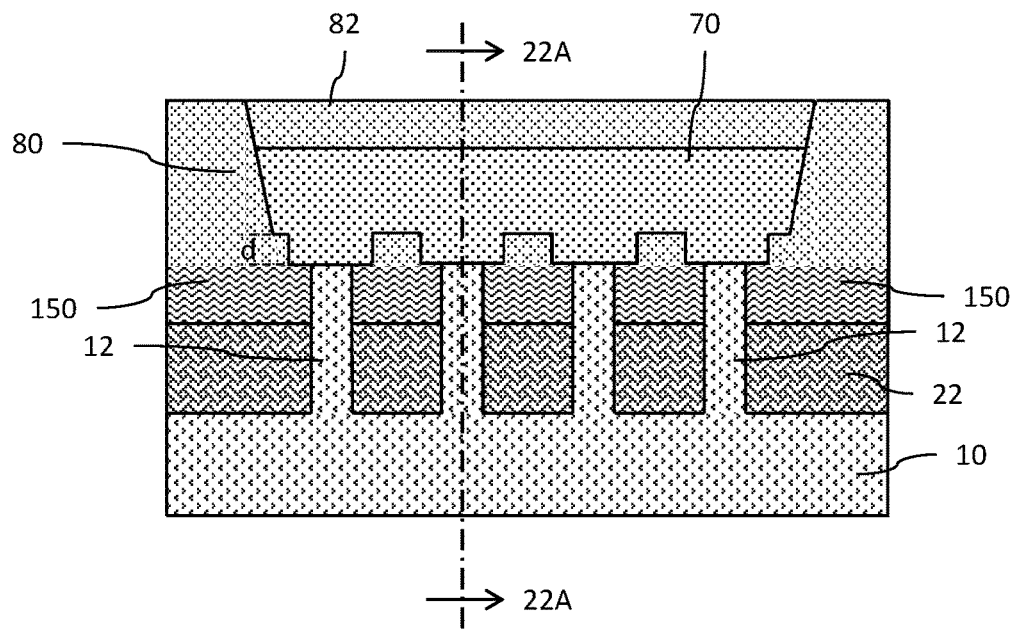

Reference is now made to FIGS. 22A-22B. A silicon dioxide material 82 is deposited to cover the substrate and fill remaining portions of the apertures 114. The material 82 may be further processed using conventional chemical-mechanical planarization (CMP) techniques to provide a planar top surface that stops at the top of each dummy gate 48.

Figure 23:
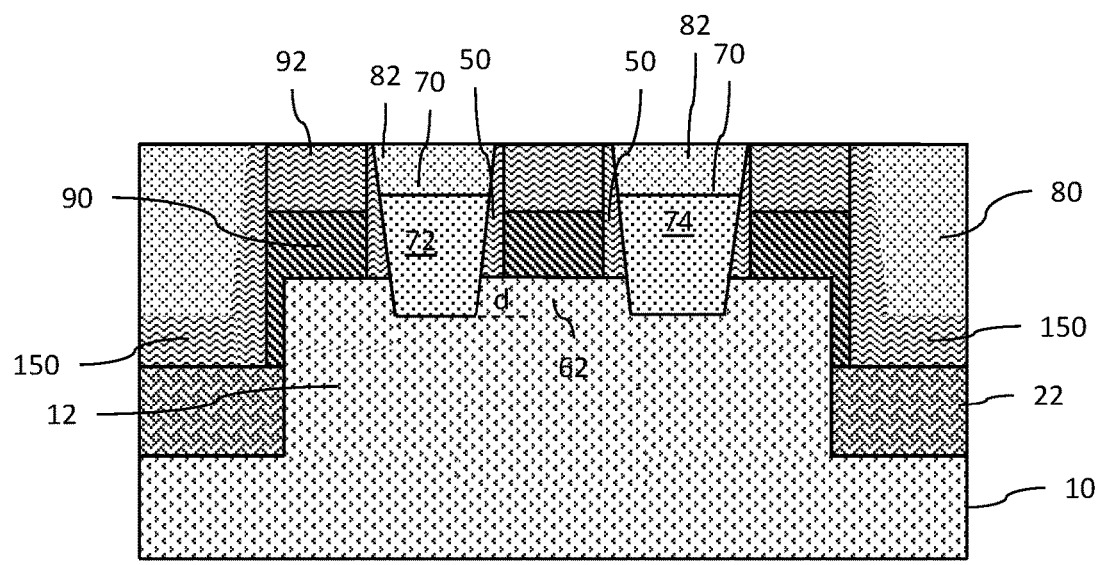

Using a selective removal process (such as an ammonium hydroxide etch), the dummy gates 48 are removed. The removed dummy gates 48 are then replaced with a metal gate structure 90. In an example, the metal gate structure may comprise a high-K dielectric liner (forming the gate dielectric for the transistor) deposited using an atomic layer deposition (ALD) process with a thickness of 1-2 nm, a work function metal deposited using a chemical vapor deposition process and a contact metal fill deposited using a chemical vapor deposition process. An insulating cap 92 covers the metal gate structure 90. The result is shown in FIG. 23.

Further processing well known to those skilled in the art is then performed to produce the metal contacts to the gate (metal gate structure 90), source region 72 and drain region 74.

At this point, front end of line (FEOL) fabrication of the integrated circuit is complete. Further back end of line (BEOL) processing to fabricate metallizations and interconnects may then be performed as well known to those skilled in the art.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated FinFET transistor circuit, comprising:
   a fin of semiconductor material;
   a transistor gate electrode extending over a channel region of said fin;
   sidewall spacers on each side of the transistor gate electrode;
   wherein said fin further includes a recessed region on each side of the channel region;
   an oxide material on each side of each recessed region in the fin;
   a raised source region of epitaxial growth material filling said recessed region and extending from said fin on a first side of the transistor gate electrode to cover the oxide material to a height above said fin and in contact with the sidewall spacer; and
   a raised drain region of said epitaxial growth material filling said recessed region and extending from said fin on a second side of the transistor gate electrode to cover the oxide material to said height above said fin and in contact with the sidewall spacer;

wherein said height is greater than a height of the transistor gate electrode.

2. The circuit of claim 1, further comprising a dielectric material on each side of a bottom portion of said fin, wherein said oxide material on each side of each recessed region in the fin is positioned above said dielectric material.

3. The circuit of claim 1, further including fin sidewall spacers on each side the fin and the recessed region, wherein said fin sidewall spacers are positioned between the oxide material on each side of each recessed region in the fin and the recessed region.

4. The circuit of claim 1, wherein the sidewall spacers extend underneath the oxide material.

5. The circuit of claim 1, further comprising a dielectric material on each side of a bottom portion of said fin, wherein said sidewall spacers extend on each side of the fin above the bottom portion, and wherein the oxide material on each side of each recessed region in the fin is positioned above said sidewall spacers.

6. The circuit of claim 1, wherein a width of the raised source and drain regions increases with increased height of the raised source and drain regions.

7. The circuit of claim 1, further comprising a dielectric material on each side of a bottom portion of said fin, wherein said recessed regions in the fin have a depth which extends to a height of the dielectric material.

8. An integrated FinFET transistor circuit, comprising:
a fin of semiconductor material;
a dielectric material on each side of a bottom portion of said fin;
an oxide material on each side of said fin above the dielectric material;
a transistor gate electrode extending over a channel region of said fin;
sidewall spacers on each side of the transistor gate electrode;
wherein said fin further includes a recessed region on each side of the channel region, with said oxide material on each side of each recessed region in the fin;
a raised source region of epitaxial growth material filling said recessed region and extending from said fin on a first side of the transistor gate electrode to cover the oxide material to a height above said fin and in contact with the sidewall spacer; and
a raised drain region of said epitaxial growth material filling said recessed region and extending from said fin on a second side of the transistor gate electrode to cover the oxide material to said height above said fin and in contact with the sidewall spacer;
wherein the sidewall spacers extend on each side of the fin above the bottom portion, and wherein the oxide material on each side of each recessed region in the fin is positioned above said sidewall spacers.

9. The circuit of claim 8, further comprising fin sidewall spacers on each side the fin and the recessed region, wherein said fin sidewall spacers are positioned between the oxide material on each side of each recessed region in the fin and the recessed region.

10. The circuit of claim 8, wherein said recessed regions in the fin have a depth which extends to a height of the dielectric material.

11. The circuit of claim 8, wherein a width of the raised source and drain regions increases with increased height of the raised source and drain regions, and said height is greater than a height of the transistor gate electrode.

12. An integrated FinFET transistor circuit, comprising:
a fin of semiconductor material;
a transistor gate electrode extending over a channel region of said fin;
a sidewall spacer on a side of the transistor gate electrode;
wherein said fin further includes a recessed region;
an oxide material on each side of the recessed region;
a raised region of epitaxial growth material filling said recessed region and extending from said fin to cover the oxide material to a height above said fin and in contact with the sidewall spacer;
wherein said height is greater than a height of the transistor gate electrode.

13. The circuit of claim 12, wherein the raised region is one of a source region or a drain region.

14. The circuit of claim 12, further comprising a dielectric material on each side of a bottom portion of said fin, wherein said oxide material on the recessed region is positioned above said dielectric material.

15. The circuit of claim 12, further including a further sidewall spacer on the fin, wherein said further sidewall spacer is positioned between the oxide material and the recessed region.

16. The circuit of claim 12, wherein a width of the raised region increases with increased height of the raised region.

17. An integrated FinFET transistor circuit, comprising:
a fin of semiconductor material;
a transistor gate electrode extending over a channel region of said fin;
sidewall spacers on each side of the transistor gate electrode;
wherein said fin further includes a recessed region on each side of the channel region;
an oxide material on each side of each recessed region in the fin, wherein the sidewall spacers extend underneath the oxide material;
a raised source region of epitaxial growth material filling said recessed region and extending from said fin on a first side of the transistor gate electrode to cover the oxide material to a height above said fin and in contact with the sidewall spacer; and
a raised drain region of said epitaxial growth material filling said recessed region and extending from said fin on a second side of the transistor gate electrode to cover the oxide material to said height above said fin and in contact with the sidewall spacer.

18. The circuit of claim 17, further comprising a dielectric material on each side of a bottom portion of said fin, wherein said oxide material on each side of each recessed region in the fin is positioned above said dielectric material.

19. The circuit of claim 17, further including fin sidewall spacers on each side the fin and the recessed region, wherein said fin sidewall spacers are positioned between the oxide material on each side of each recessed region in the fin and the recessed region.

20. The circuit of claim 17, further comprising a dielectric material on each side of a bottom portion of said fin, wherein said sidewall spacers extend on each side of the fin above the bottom portion, and wherein the oxide material on each side of each recessed region in the fin is positioned above said sidewall spacers.

21. The circuit of claim 17, wherein a width of the raised source and drain regions increases with increased height of the raised source and drain regions.

22. The circuit of claim 17, further comprising a dielectric material on each side of a bottom portion of said fin, wherein said recessed regions in the fin have a depth which extends to a height of the dielectric material.

23. An integrated FinFET transistor circuit, comprising:
a fin of semiconductor material;
a transistor gate electrode extending over a channel region of said fin;
sidewall spacers on each side of the transistor gate electrode;
wherein said fin further includes a recessed region on each side of the channel region;
an oxide material on each side of each recessed region in the fin;
a raised source region of epitaxial growth material filling said recessed region and extending from said fin on a first side of the transistor gate electrode to cover the oxide material to a height above said fin and in contact with the sidewall spacer;
a raised drain region of said epitaxial growth material filling said recessed region and extending from said fin on a second side of the transistor gate electrode to cover the oxide material to said height above said fin and in contact with the sidewall spacer; and
a dielectric material on each side of a bottom portion of said fin, wherein said sidewall spacers extend on each side of the fin above the bottom portion, and wherein the oxide material on each side of each recessed region in the fin is positioned above said sidewall spacers.

24. The circuit of claim 23, further comprising a dielectric material on each side of a bottom portion of said fin, wherein said oxide material on each side of each recessed region in the fin is positioned above said dielectric material.

25. The circuit of claim 23, further including fin sidewall spacers on each side the fin and the recessed region, wherein said fin sidewall spacers are positioned between the oxide material on each side of each recessed region in the fin and the recessed region.

26. The circuit of claim 23, wherein a width of the raised source and drain regions increases with increased height of the raised source and drain regions.

27. The circuit of claim 23, further comprising a dielectric material on each side of a bottom portion of said fin, wherein said recessed regions in the fin have a depth which extends to a height of the dielectric material.

28. An integrated FinFET transistor circuit, comprising:
a fin of semiconductor material;
a dielectric material on each side of a bottom portion of said fin;
an oxide material on each side of said fin above the dielectric material;
a transistor gate electrode extending over a channel region of said fin;
sidewall spacers on each side of the transistor gate electrode;
wherein said fin further includes a recessed region on each side of the channel region, with said oxide material on each side of each recessed region in the fin;
a raised source region of epitaxial growth material filling said recessed region and extending from said fin on a first side of the transistor gate electrode to cover the oxide material to a height above said fin and in contact with the sidewall spacer; and
a raised drain region of said epitaxial growth material filling said recessed region and extending from said fin on a second side of the transistor gate electrode to cover the oxide material to said height above said fin and in contact with the sidewall spacer;
wherein a width of the raised source and drain regions increases with increased height of the raised source and drain regions, and said height is greater than a height of the transistor gate electrode.

29. The circuit of claim 28, further comprising fin sidewall spacers on each side the fin and the recessed region, wherein said fin sidewall spacers are positioned between the oxide material on each side of each recessed region in the fin and the recessed region.

30. The circuit of claim 28, wherein said recessed regions in the fin have a depth which extends to a height of the dielectric material.

* * * * *